(12) United States Patent
Ozeki et al.

(10) Patent No.: US 11,676,972 B2
(45) Date of Patent: Jun. 13, 2023

(54) DISPLAY DEVICE

(71) Applicant: Japan Display Inc., Tokyo (JP)

(72) Inventors: Yoshitaka Ozeki, Tokyo (JP); Satoshi Tokura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/716,070

(22) Filed: Apr. 8, 2022

(65) Prior Publication Data

US 2022/0328531 A1 Oct. 13, 2022

(30) Foreign Application Priority Data

Apr. 9, 2021 (JP) .............................. JP2021-066632
Feb. 21, 2022 (JP) .............................. JP2022-024957

(51) Int. Cl.
*G02F 1/1362* (2006.01)
*H01L 27/12* (2006.01)
*G02F 1/1368* (2006.01)

(52) U.S. Cl.
CPC ........ *H01L 27/1225* (2013.01); *G02F 1/1368* (2013.01); *G02F 1/136286* (2013.01); *H01L 27/124* (2013.01)

(58) Field of Classification Search
CPC .................................................... G02F 1/1362
See application file for complete search history.

(56) References Cited

U.S. PATENT DOCUMENTS

| | | | |
|---|---|---|---|
| 4,042,946 A * | 8/1977 | Sokoloski | H01L 29/495 257/253 |
| 2009/0140438 A1 * | 6/2009 | Yamazaki | H01L 29/66765 257/784 |
| 2010/0099216 A1 | 4/2010 | Suzawa et al. | |
| 2015/0155505 A1 | 6/2015 | Yamazaki et al. | |
| 2018/0233594 A1 * | 8/2018 | Imazawa | G02F 1/1368 |
| 2022/0005839 A1 * | 1/2022 | Daitoh | H01L 27/1225 |

FOREIGN PATENT DOCUMENTS

JP 2015-187701 A 10/2015
JP 2020-025114 A 2/2020

* cited by examiner

*Primary Examiner* — Sang V Nguyen
(74) *Attorney, Agent, or Firm* — K&L Gates LLP

(57) ABSTRACT

A display device includes a first transistor. The first transistor includes an oxide semiconductor layer, a first gate electrode facing the oxide semiconductor layer and a gate insulating layer between the oxide semiconductor layer and the first gate electrode. The first gate electrode has hydrogen storage properties.

13 Claims, 27 Drawing Sheets

DISPLAY DEVICE

CROSS REFERENCE TO RELATED APPLICATIONS

This application is based upon and claims the benefit of priority from the prior Japanese Patent Application No. 2021-066632 filed on Apr. 9, 2021 and the prior Japanese Patent Application No. 2022-024957 filed on Feb. 21, 2022, the entire contents of which are incorporated herein by reference.

FIELD

One embodiment of the present invention relates to a display device. In particular, one embodiment of the present invention relates to a display device using a transistor having an oxide semiconductor.

BACKGROUND

Recently, a transistor using an oxide semiconductor as a channel has been developed in place of an amorphous silicon, a low-temperature polysilicon, and a single-crystal silicon (e.g., Japanese laid-open patent publication No. 2015-187701 and Japanese laid-open patent publication No. 2020-025114). The transistor using the oxide semiconductor as the channel is formed in a simple-structured, low-temperature process similar to a transistor using an amorphous silicon as a channel. It is known that the transistor using the oxide semiconductor as the channel has higher mobility than the transistor using the amorphous silicon as the channel and has a very low off-current.

In order for a transistor in which oxide semiconductor is used as a channel to have a stable operation, it is essential to reduce oxygen vacancies formed in the oxide semiconductor by supplying more oxygen to the oxide semiconductor in a manufacturing process for the transistor. As one method for supplying oxygen to the oxide semiconductor, Japanese laid-open patent publication No. 2015-187701 and Japanese laid-open patent publication No. 2020-025114 disclose a technique in which an insulating layer covering the oxide semiconductor is formed under the condition such that an insulating layer contains more oxygen.

For example, hydrogen-containing layers are used in a transistor used in a display device. For example, a hydrogen-containing layer may be used as an insulating layer for insulating stacked conductive layers which are adjacent to each other. When the hydrogen emitted from the insulating layer reaches an oxide semiconductor layer constituting the transistor, the oxide semiconductor is reduced. Consequently, oxygen deficiencies formed in the oxide semiconductor are increased, the electrical characteristics of the transistor varies (e.g., a threshold voltage is negatively shifted), and there are problems in the reliability of the display device in which the transistor is used.

SUMMARY

A display device according to an embodiment of the present disclosure includes a first transistor. The first transistor includes an oxide semiconductor layer, a first gate electrode facing the oxide semiconductor layer and a gate insulating layer between the oxide semiconductor layer and the first gate electrode. The first gate electrode has hydrogen storage properties.

A display device according to an embodiment of the present disclosure includes a first transistor. The first transistor includes an oxide semiconductor layer, a first gate electrode facing the oxide semiconductor layer and a gate insulating layer between the oxide semiconductor layer and the first gate electrode. The first gate electrode includes a first conducive layer capable of forming a metal hydride on a surface of the first conducive layer.

DESCRIPTION OF EMBODIMENTS

Figure 1A:
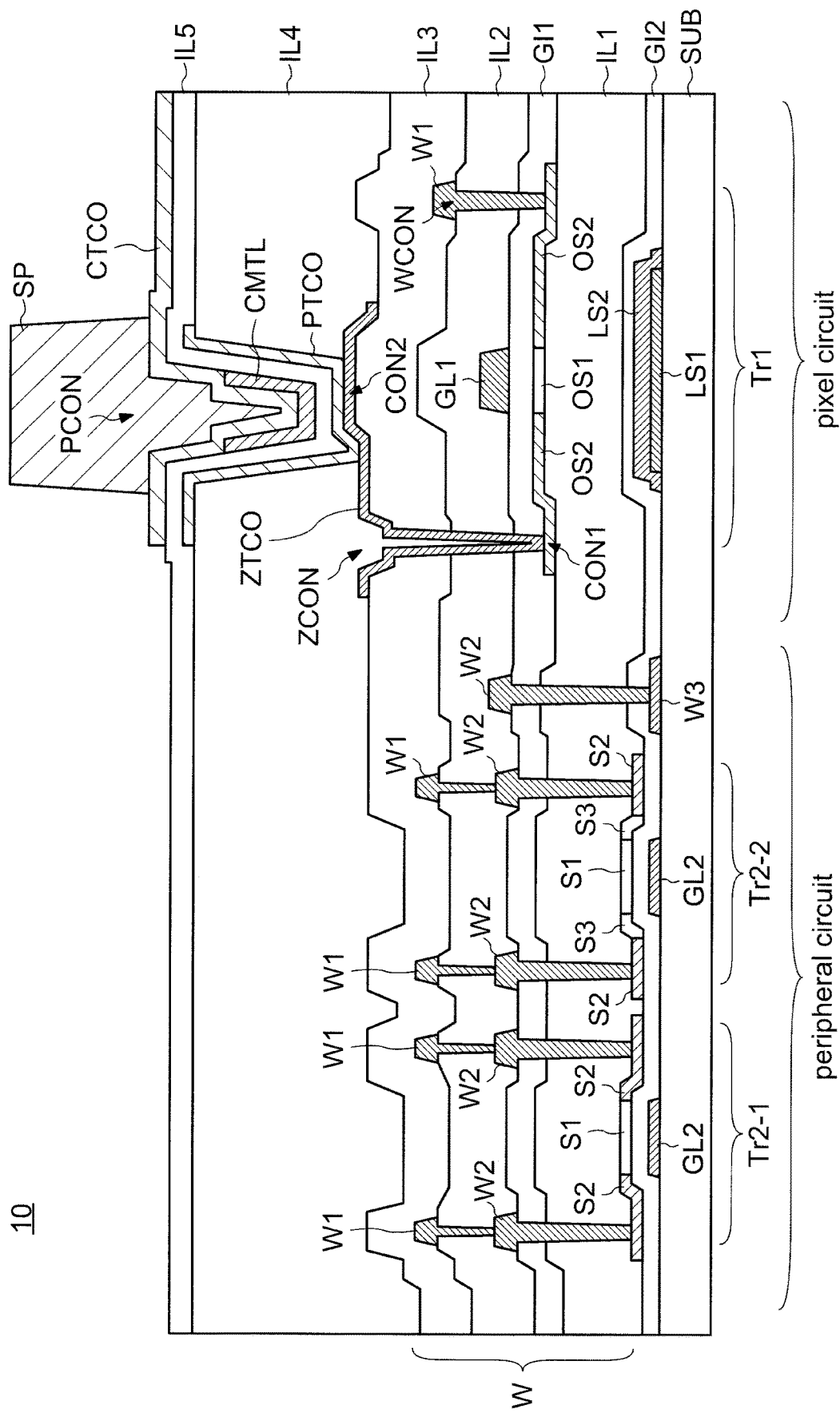
FIG. 1A is a cross-sectional view showing an outline of a display device according to an embodiment of the present invention.

Embodiments of the present invention will be described below with reference to the drawings. The following disclosure is merely an example. A configuration that can be easily conceived by a person skilled in the art by appropriately changing the configuration of the embodiment while maintaining the gist of the invention is naturally included in the scope of the present invention. For the sake of clarity of description, the drawings may be schematically represented with respect to widths, thicknesses, shapes, and the like of the respective portions in comparison with actual embodiments. However, the shape shown is merely an example and does not limit the interpretation of the present invention. In this specification and each of the drawings, the same symbols are assigned to the same components as those described previously with reference to the preceding drawings, and a detailed description thereof may be omitted as appropriate.

In the embodiments of the present invention, a direction from a substrate to an oxide semiconductor layer is referred to as upper or above. On the contrary, a direction from the oxide semiconductor layer to the substrate is referred to as lower or below. As described above, for convenience of explanation, although the phrase "above" or "below" is used for explanation, for example, a vertical relationship between the substrate and the oxide semiconductor layer may be arranged in a different direction from that shown in the drawing. In the following description, for example, the expression "the oxide semiconductor layer on the substrate" merely describes the vertical relationship between the substrate and the oxide semiconductor layer as described above, and other members may be arranged between the substrate and the oxide semiconductor layer. Above or below means a stacking order in a structure in which multiple layers are stacked, and when it is expressed as a pixel electrode above a transistor, it may be a positional relationship where the transistor and the pixel electrode do not overlap each other in a plan view. On the other hand, when it is expressed as a pixel electrode vertically above a transistor, it means a positional relationship where the transistor and the pixel electrode overlap each other in a plan view.

"Display device" refers to a structure configured to display an image using electro-optic layers. For example, the term display device may refer to a display panel including the electro-optic layer, or it may refer to a structure in which other optical members (e.g., polarizing member, backlight, touch panel, etc.) are attached to a display cell. The "electro-optic layer" can include a liquid crystal layer, an electroluminescence (EL) layer, an electrochromic (EC) layer, and an electrophoretic layer, as long as there is no technical contradiction. Therefore, although the embodiments described later will be described by exemplifying the liquid crystal display device including a liquid crystal layer as the display device, the structure in the present embodiment can be applied to a display device including the other electro-optical layers described above.

The expressions "α includes A, B, or C", "α includes any of A, B, and C", and "α includes one selected from a group consisting of A, B, and C" do not exclude the case where α includes multiple combinations of A to C unless otherwise specified. Furthermore, these expressions do not exclude the case where α includes other elements.

The following embodiments may be combined with each other as long as there is no technical contradiction.

It is an object of one embodiment of the present disclosure to realize a highly reliable display device.

1. First Embodiment 1-1. Configuration of Display Device 10

Figure 1B:
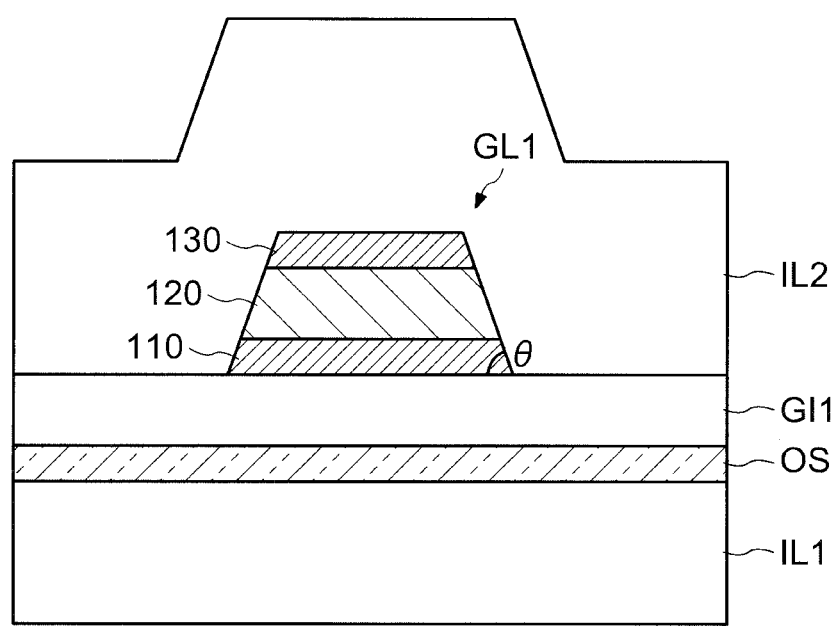
FIG. 1B is a cross-sectional view showing a structure of a transistor according to an embodiment of the present invention.
Figure 2:
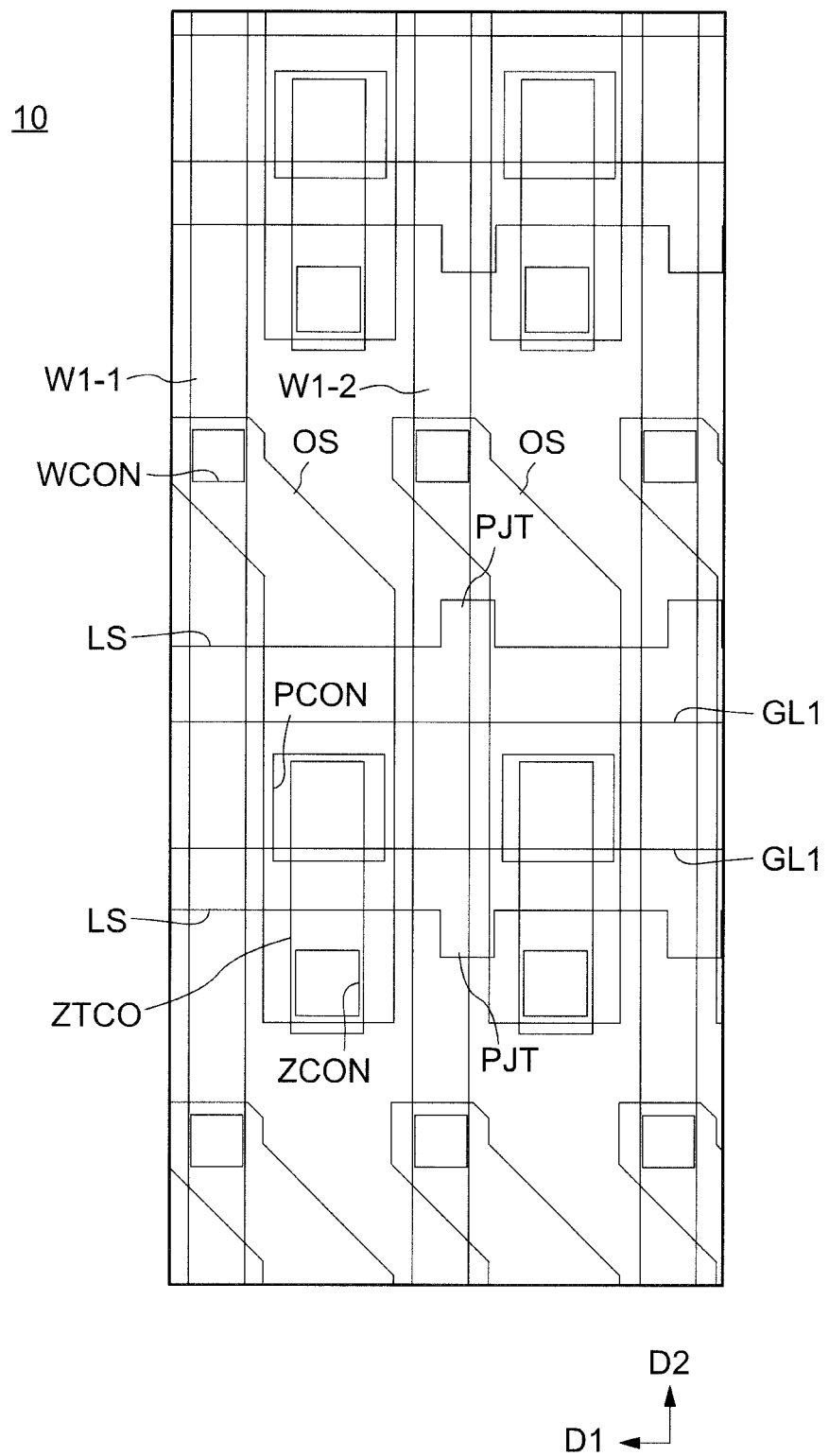
FIG. 2 is a plan view showing an outline of a display device according to an embodiment of the present invention.

A configuration of a display device 10 according to an embodiment of the present invention will be described with reference to FIG. 1A to FIG. 13. FIG. 1A is a cross-sectional view showing an outline of a display device according to an embodiment of the present invention. FIG. 1B is a cross-sectional view showing a structure of a transistor according to an embodiment of the present invention. FIG. 2 is a plan view showing an outline of a display device according to an embodiment of the present invention. FIG. 3 to FIG. 13 are plan views illustrating layouts of each layer in a display device according to an embodiment of the present invention. The cross-sectional view in FIG. 1A is for explaining a layer structure of the display device 10, which may not exactly match the plan view in FIG. 2.

As shown in FIG. 1A, the display device 10 includes a substrate SUB. The display device 10 also includes a transistor Tr1, a transistor Tr2, a wiring W, a connecting electrode ZTCO, a pixel electrode PTCO, a common auxiliary electrode CMTL, and a common electrode CTCO on the substrate SUB. TCO is an abbreviation for Transparent Conductive Oxide. The transistor Tr1 is a transistor included in a pixel circuit of the display device 10. The transistor Tr2 is a transistor included in a peripheral circuit. As will be described in detail later, the peripheral circuit is a circuit configured to drive the pixel circuit.

1-2. Configuration of Transistor Tr1

The transistor Tr1 includes an oxide semiconductor layer OS (OS1, OS2), a gate insulating layer GI1 (first gate insulating layer), and a gate electrode GL1 (first gate electrode). The gate electrode GL1 faces the oxide semiconductor layer OS. The gate insulating layer GI1 is provided between the oxide semiconductor layer OS and the gate electrode GL1. In the present embodiment, although a top gate type transistor in which the oxide semiconductor layer OS is provided closer to the substrate SUB than the gate electrode GL1 is exemplified, a bottom gate type transistor in which a positional relationship between the gate electrode GL1 and the oxide semiconductor layer OS is reversed may be applied.

The oxide semiconductor layer OS includes oxide semiconductor layers OS1, OS2. The oxide semiconductor layer OS1 is an oxide semiconductor layer in an area overlapping the gate electrode GL1 in a plan view. The oxide semiconductor layer OS1 functions as a semiconductor layer and is switched between a conductive state and a non-conductive state according to a voltage supplied to the gate electrode GL1. That is, the oxide semiconductor layer OS1 functions as a channel for the transistor Tr1. The oxide semiconductor layer OS2 functions as a conductive layer. The oxide semiconductor layers OS1, OS2 are layers formed from the same oxide semiconductor layer. For example, the oxide semiconductor layer OS2 is a low resistance oxide semiconductor layer formed by doping impurities into a layer which has the same physical properties as the oxide semiconductor layer OS1.

An insulating layer IL2 is provided above the gate electrode GL1. A wiring W1 is provided above the insulating layer IL2. The wiring W1 is connected to the oxide semiconductor layer OS2 via an opening WCON provided in the insulating layer IL2 and the gate insulating layer GI1. A data signal related to pixel gradation is transmitted to the wiring W1. An insulating layer IL3 is provided above the insulating layer IL2 and the wiring W1. The connecting electrode ZTCO is provided above the insulating layer IL3. The connecting electrode ZTCO is connected to the oxide semiconductor layered OS2 via an opening ZCON provided in the insulating layers IL3, IL2, and the gate insulating layer GI1. The connecting electrode ZTCO is in contact with the oxide semiconductor layer OS2 at the bottom of the opening ZCON. The connecting electrode ZTCO is a transparent conductive layer.

An area where the connecting electrode ZTCO and the oxide semiconductor layers OS2 are in contact with each other is referred to as a first contact area CON1. As will be described in detail later, the connecting electrode ZTCO is in contact with the oxide semiconductor layer OS2 in the first contact area CON1 not overlapping the gate electrode GL1 and the wiring W1 in a plan view. The first contact area CON1 is included in the display area of a pixel in a plan view.

For example, when a transparent conductive layer such as an ITO layer is formed in contact with a semiconductor layer such as a silicon layer, a surface of the semiconductor layer is oxidized by a process gas or oxygen ions at the time of a deposition of an ITO film. Since an oxide layer formed on the surface of the semiconductor layer is high resistance, a contact resistance between the semiconductor layer and the transparent conductive layer is increased. As a result, there is a defect in an electrical contact between the semiconductor layer and the transparent conductive layer. On the other hand, even if the above transparent conductive layer is formed so as to be in contact with the oxide semiconductor layer, a high resistance oxide layer as described above is not formed on a surface of the oxide semiconductor layer. Therefore, there is no defect in the electrical contact between the oxide semiconductor layer and the transparent conductive layer.

An insulating layer IL4 is provided above the connecting electrode ZTCO. The insulating layer IL4 eases (flattens) a step formed from a structure provided below the insulating layer IL4. The insulating layer IL4 may be referred to as a planarization film. The pixel electrode PTCO is provided above the insulating layer IL4. The pixel electrode PTCO is connected to the connecting electrode ZTCO via an opening PCON provided in the insulating layer IL4. An area where the connecting electrode ZTCO and the pixel electrode PTCO are in contact with each other is referred to as a second contact area CON2. The second contact area CON2 overlaps the gate electrode GL1 in a plan view. The pixel electrode PTCO is a transparent conductive layer.

An insulating layer IL5 is provided above the pixel electrode PTCO. The common auxiliary electrode CMTL and the common electrode CTCO are provided above the insulating layer IL5. That is, the pixel electrode PTCO faces the common electrode CTCO via the insulating layer IL5. The common electrode CTCO is connected to the common auxiliary electrode CMTL at the opening PCON (in the second contact area CON2). As will be described in detail later, the common auxiliary electrode CMTL and the common electrode CTCO have different patterns respectively when seen in a plan view. The common auxiliary electrode CMTL is a metal layer. The common electrode CTCO is a transparent conductive layer. The electric resistance of the common auxiliary electrode CMTL is lower than the electric resistance of the common electrode CTCO. The common auxiliary electrode CMTL also functions as a light-shielding layer. For example, the common auxiliary electrode CMTL shields light from adjacent pixels to suppress color mixing from occurring. A spacer SP is provided above the common electrode CTCO.

The spacer SP is provided for a part of the pixels. For example, the spacer SP may be provided for any one of a blue pixel, a red pixel and a green pixel. However, the spacer SP may be provided for all the pixels. A height of the spacer SP is half the height of a cell gap. A spacer is also provided on a counter substrate, and the spacer on the counter substrate and the above spacer SP overlap in a plan view.

A light-shielding layer LS is provided between the transistor Tr1 and the substrate SUB. In the present embodiment, light-shielding layers LS1, LS2 are provided as the light-shielding layer LS. However, the light-shielding layer LS may be formed of only the light-shielding layer LS1 or LS2. In a plan view, the light-shielding layer LS is provided in an area where the gate electrode GL1 and the oxide semiconductor layer OS overlap. That is, in a plan view, the light-shielding layer LS is provided in an area overlapping the oxide semiconductor layer OS1. The light-shielding layer LS suppresses the light incident from the substrate SUB side from reaching the oxide semiconductor layer OS1. In the case where a conductive layer is used as the light-shielding layer LS, a voltage may be applied to the light-shielding layer LS to control the oxide semiconductor layer OS1. In the case where a voltage is applied to the light-shielding layer LS, the light-shielding layer LS and the gate electrode GL1 may be connected by a peripheral area of the pixel circuit. In a plan view, the above first contact area CON1 is provided in an area not overlapping the light-shielding layer LS.

1-3. Configuration of Transistor Tr2

The transistor Tr2 has a p-type transistor Tr2-1 and an n-type transistor Tr2-2. The transistor Tr2 may be referred to as a "second transistor."

The p-type transistor Tr2-1 and the n-type transistor Tr2-2 both include a gate electrode GL2, a gate insulating layer GI2, and a semiconductor layer S (S1, S2 and S3). The gate electrode GL2 faces the semiconductor layer S. The gate insulating layer GI2 is provided between the semiconductor layer S and the gate electrode GL2. In the present embodiment, although a bottom gate type transistor in which the gate electrode GL2 is provided closer to the substrate SUB than the semiconductor layer S is exemplified, a top gate type transistor in which a positional relationship between the semiconductor layer S and the gate electrode GL2 is reversed may be used as the display device. The gate electrode GL2 may be referred to as a "second gate electrode". The gate insulating layer GI2 may be referred to as a "second gate insulating layer".

The semiconductor layer S of the p-type transistor Tr2-1 includes semiconductor layers S1 and S2. The semiconductor layer S of the n-type transistor Tr2-2 includes the semiconductor layers S1, S2 and S3. The semiconductor layer S1 is a semiconductor layer overlapping the gate electrode GL2 in a plan view. The semiconductor layer S1 functions as a channel for the transistors Tr2-1 and Tr2-2. The semiconductor layer S2 functions as a conductive layer. The semiconductor layer S3 functions as a conductive layer with a higher resistance than the semiconductor layer S2. The semiconductor layer S3 suppresses hot carrier degradation by attenuating hot carriers intruding toward the semiconductor layer S1.

An insulating layer IL1 and the gate insulating layer GI1 are provided on the semiconductor layer S. In the transistor Tr2, the gate insulating layer GI1 simply functions as an interlayer film (first insulating layer). That is, the first insulating layer covers the transistor Tr2. In this case, the first insulating layer is arranged in the same layer as the gate insulating layer GI1. A wiring W2 is provided above these insulating layers. The wiring W2 is connected to the semiconductor layer S via an opening provided in the insulating layer IL1 and the gate insulating layer GI1. The insulating layer IL2 is provided on the wiring W2. The wiring W1 is provided on the insulating layer IL2. The wiring W1 is connected to the wiring W2 via an opening provided in the insulating layer IL2.

As shown in FIG. 1A, the gate electrode GL2 provided in the peripheral circuit and a light shielding layer LS2 provided in the pixel circuit are arranged in the same layer. The wiring W2 provided in the peripheral circuit (first peripheral circuit wiring) and the gate electrode GL1 provided in the pixel circuit (first gate electrode) are arranged in the same layer. In the peripheral circuit, the wiring W2 is connected to the wiring W3 (second peripheral circuit) provided in the same layer as the gate electrode GL2 via a contact hole, which is formed in insulating layers (the gate insulating layer GI1, the insulating layer IL1, the gate insulating layer GI2) and penetrates the insulating layers. The same layer means that a plurality of members are formed from one patterned layer or are simultaneously formed by patterning the same single layer material or the same laminated materials in the same process. That is, a thickness of each layer of the gate electrode GL1 and a taper angle of each layer of the gate electrode GL1 are substantially the same as a thickness of each layer of the wiring W2 and a taper angle of each layer of the wiring W2.

1-4. Configuration of Gate Electrode GL1

A detailed cross-sectional configuration of the gate electrode GL1 will be described with reference to FIG. 1B. As shown in FIG. 1B, the gate electrode GL1 has a first conductive layer 110, a second conductive layer 120, and a third conductive layer 130. The first conductive layer 110 is provided above the gate insulating layer GI1 and is in contact with the gate insulating layer GI1. The second conductive layer 120 is provided above the first conductive layer 110 and is in contact with the first conductive layer 110. The third conductive layer 130 is provided above the second conductive layer 120 and is in contact with the second conductive layer 120.

A side part of each of the first conductive layer 110, the second conductive layer 120, and the third conductive layer 130 has a tapered shape with an inclined surface facing upward. In FIG. 1B, an angle formed by the inclined surface and the gate insulating layer GI1 (or an upper surface of the substrate SUB or the horizontal surface) is referred to as a taper angle θ. In FIG. 1B, although the tapered shapes in which sides of these conductive layers are arranged on a straight line is shown, the present invention is not limited to this configuration. For example, tilted angles of the side surfaces of the conductive layers may be different from each other. An upper end of the side surface of the first conductive layer 110 may not coincide with a lower end of the side surface of the second conductive layer 120. Similarly, an upper end of the side surface of the second conductive layer 120 may not coincide with a lower end of the side surface of the third 130. For example, a part of the upper surface of the first conductive layer 110 may be exposed from the second conductive layer 120. Similarly, a part of the upper surface of the second conductive layer 120 may be exposed from the third conductive layer 130.

A material having hydrogen storage properties is used as the first conductive layer 110 and the third conductive layer 130. In other words, a material capable of forming a metal hydride on a surface thereof is used as the first conductive layer 110 and the third conductive layer 130. Specifically, titanium (Ti), magnesium (Mg), vanadium (V), rantan (La), and alloys containing these materials are used as the first conductive layer 110 and the third conductive layer 130. For example, when Ti is used as the first conductive layer 110 and the third conductive layer 130, the Ti absorbs water and hydrogen contained in the acidic liquid in the manufacturing process to form a metal hydride (TiH$_2$). In this manner, the first conductive layer 110 and the third conductive layer 130 have hydrogen storage properties by forming hydrides from the above materials such as Ti.

A material having lower resistance than the first conductive layer 110 and the third conductive layer 130 is used as the second conductive layer 120. For example, aluminum (Al), molybdenum (Mo), tungsten (W), silver (Ag), and an alloy containing these materials (for example, an alloy of molybdenum and tungsten) are used as the second conductive layer 120.

1-5. Plane Layout of Display Device 10

Figure 12:
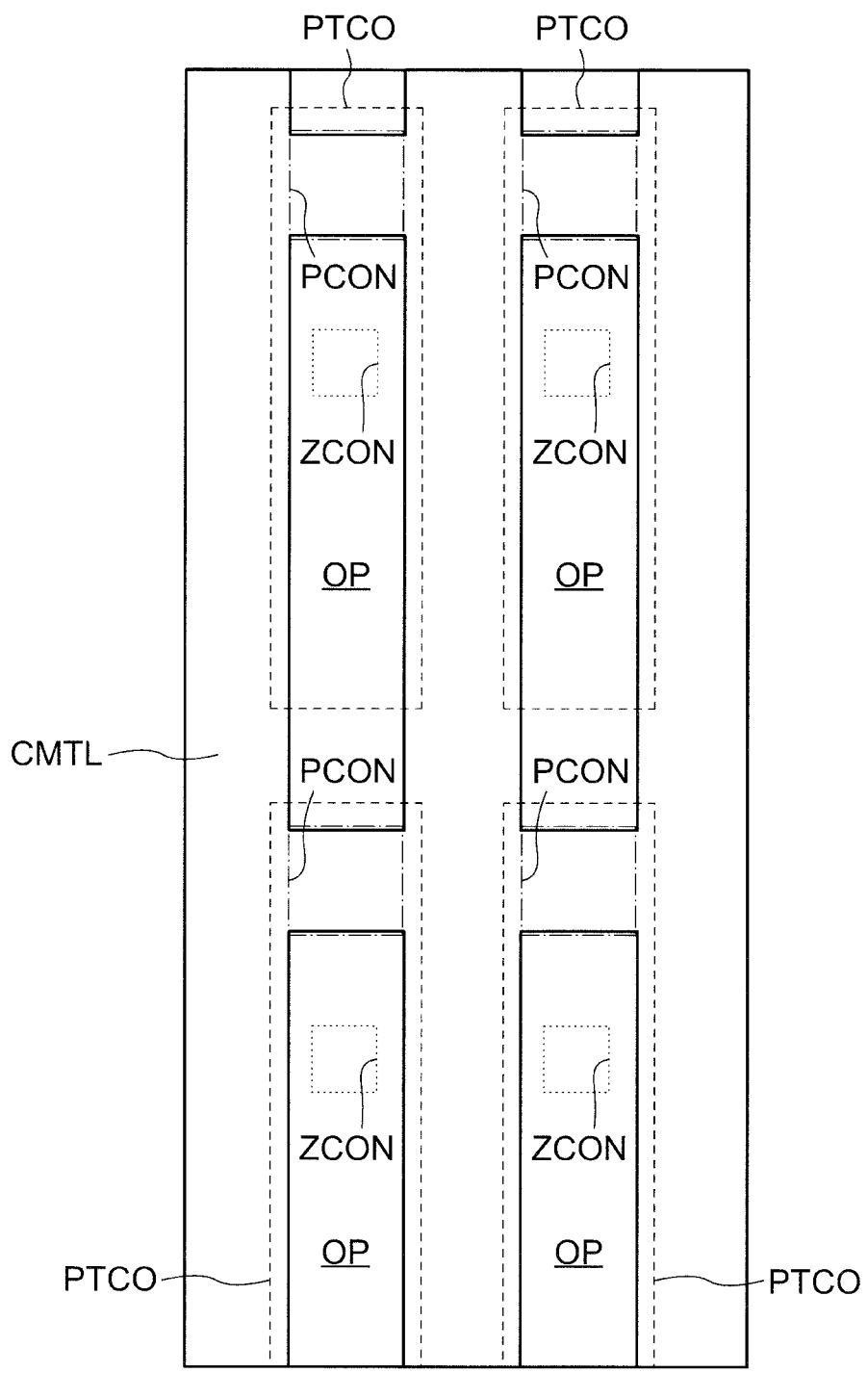
FIG. 12 is a plan view illustrating a layout of one or more layers in a display device according to an embodiment of the present invention.
Figure 13:
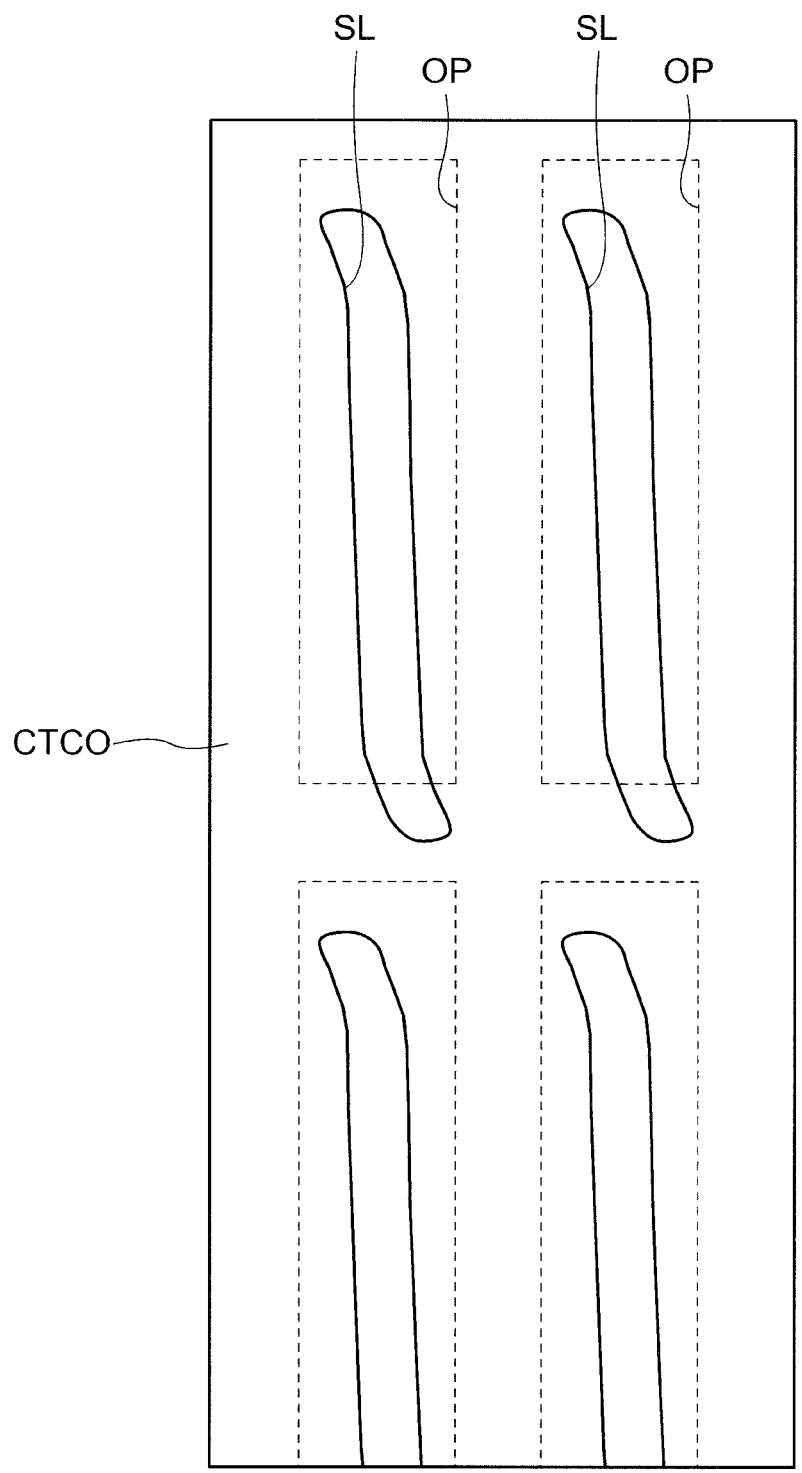
FIG. 13 is a plan view illustrating a layout of one or more layers in a display device according to an embodiment of the present invention.

A plane layout of a pixel of the display device 10 will be described with reference to FIG. 2 to FIG. 13. In FIG. 2, the pixel electrode PTCO, the common auxiliary electrode CMTL, the common electrode CTCO, and the spacer SP are omitted. The plane layout of the pixel electrode PTCO, the common auxiliary electrode CMTL, and the common electrode CTCO are shown in FIG. 11 to FIG. 13, respectively.

Figure 3:
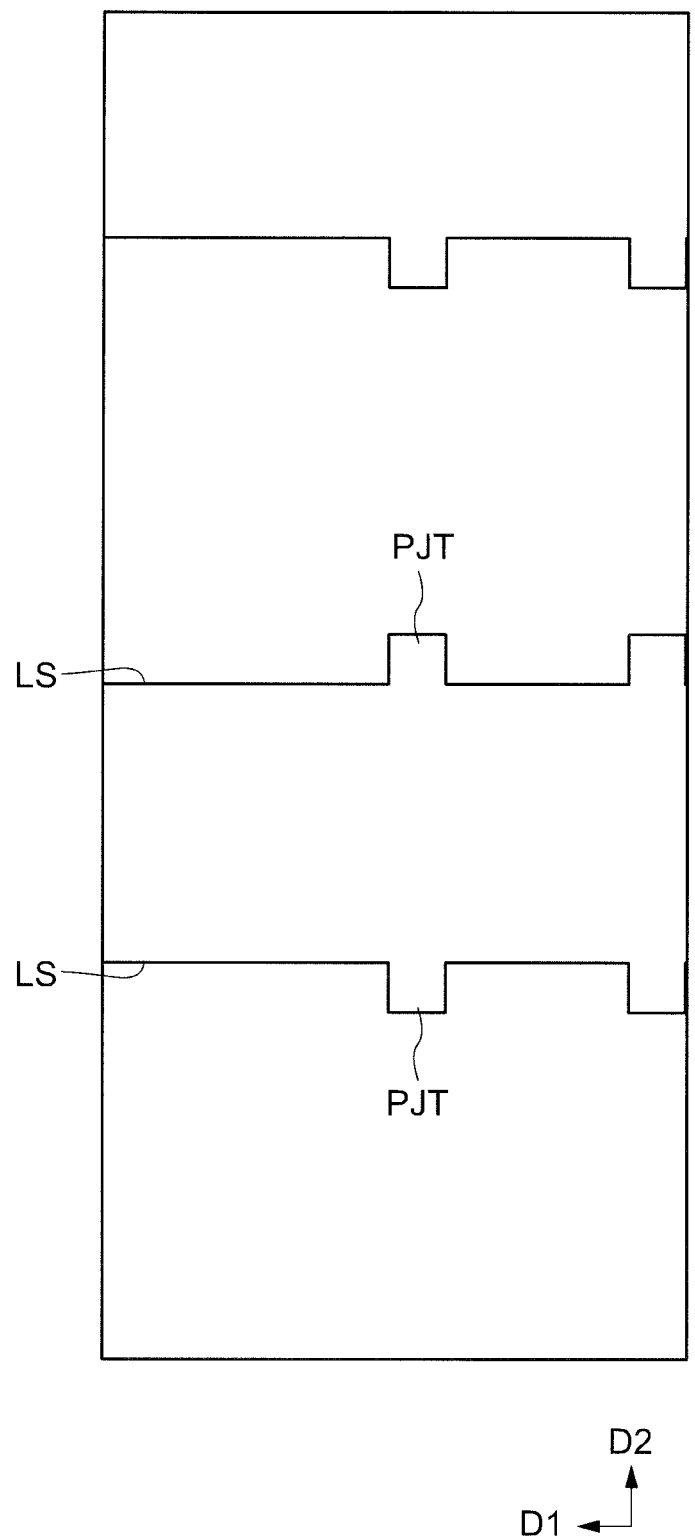
FIG. 3 is a plan view illustrating a layout of each layer in a display device according to an embodiment of the present invention.
Figure 5:
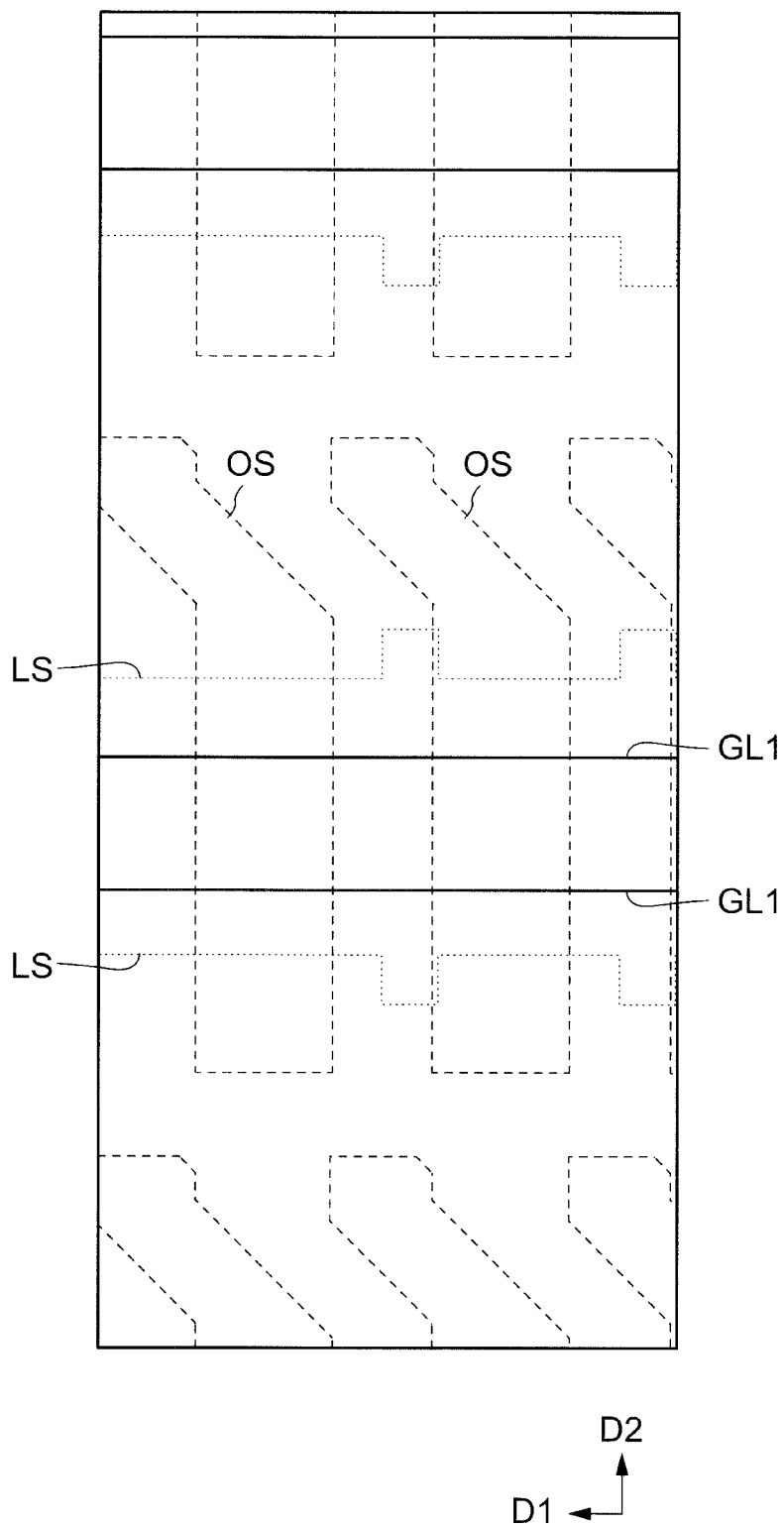
FIG. 5 is a plan view illustrating a layout of one or more layers in a display device according to an embodiment of the present invention.

As shown in FIG. 2 and FIG. 3, the light-shielding layer LS extends in a direction D1. A shape of the light-shielding layer LS may be different depending on the pixel. In the present embodiment, a protruding part PJT protruding in a direction D2 is provided from a part of the light-shielding layer LS extending in the direction D1. As shown in FIG. 5, the light-shielding layer LS is provided in an area including the area where the gate electrode GL1 and the oxide semiconductor layer OS overlap in a plan view. The gate electrode GL1 can also be referred to as a "gate line."

Figure 4:
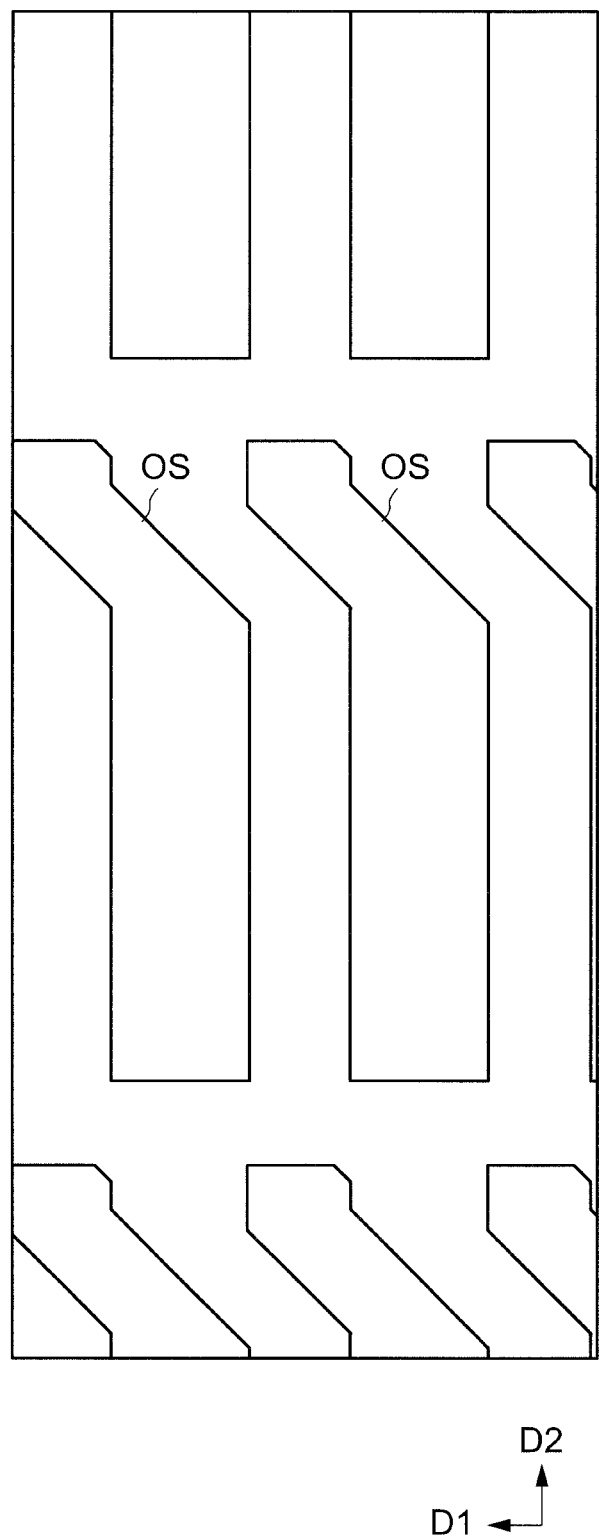
FIG. 4 is a plan view illustrating a layout of one or more layers in a display device according to an embodiment of the present invention.

As shown in FIG. 2, FIG. 4, and FIG. 5, the oxide semiconductor layer OS extends in the direction D2. The gate electrode GL1 extends in the direction D1 so as to intersect the oxide semiconductor layer OS. A pattern of the gate electrode GL1 is provided inside a pattern of the light-shielding layer LS. In other words, the oxide semiconductor layers OS is formed in a long shape intersecting the gate electrode GL1.

Figure 6:
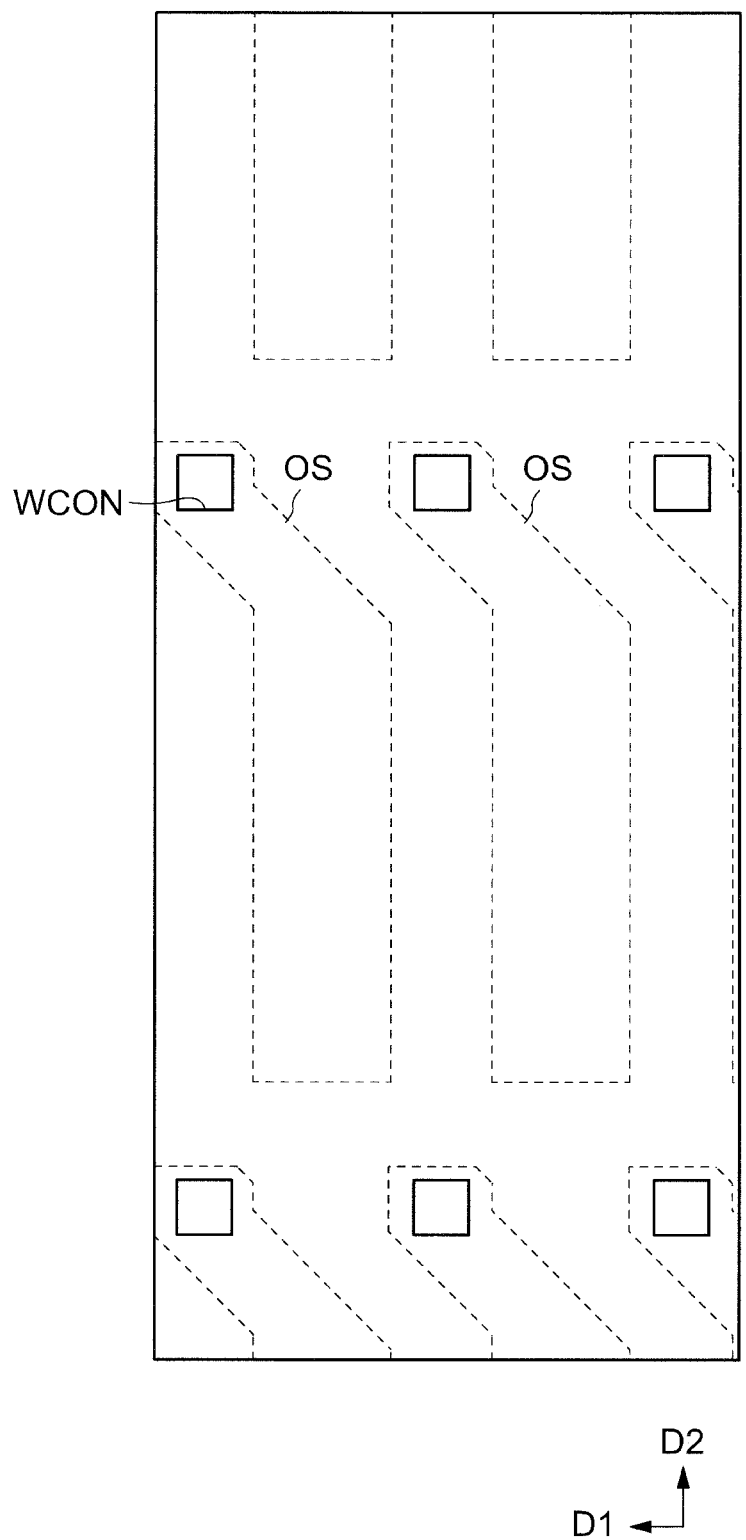
FIG. 6 is a plan view illustrating a layout of one or more layers in a display device according to an embodiment of the present invention.
Figure 7:
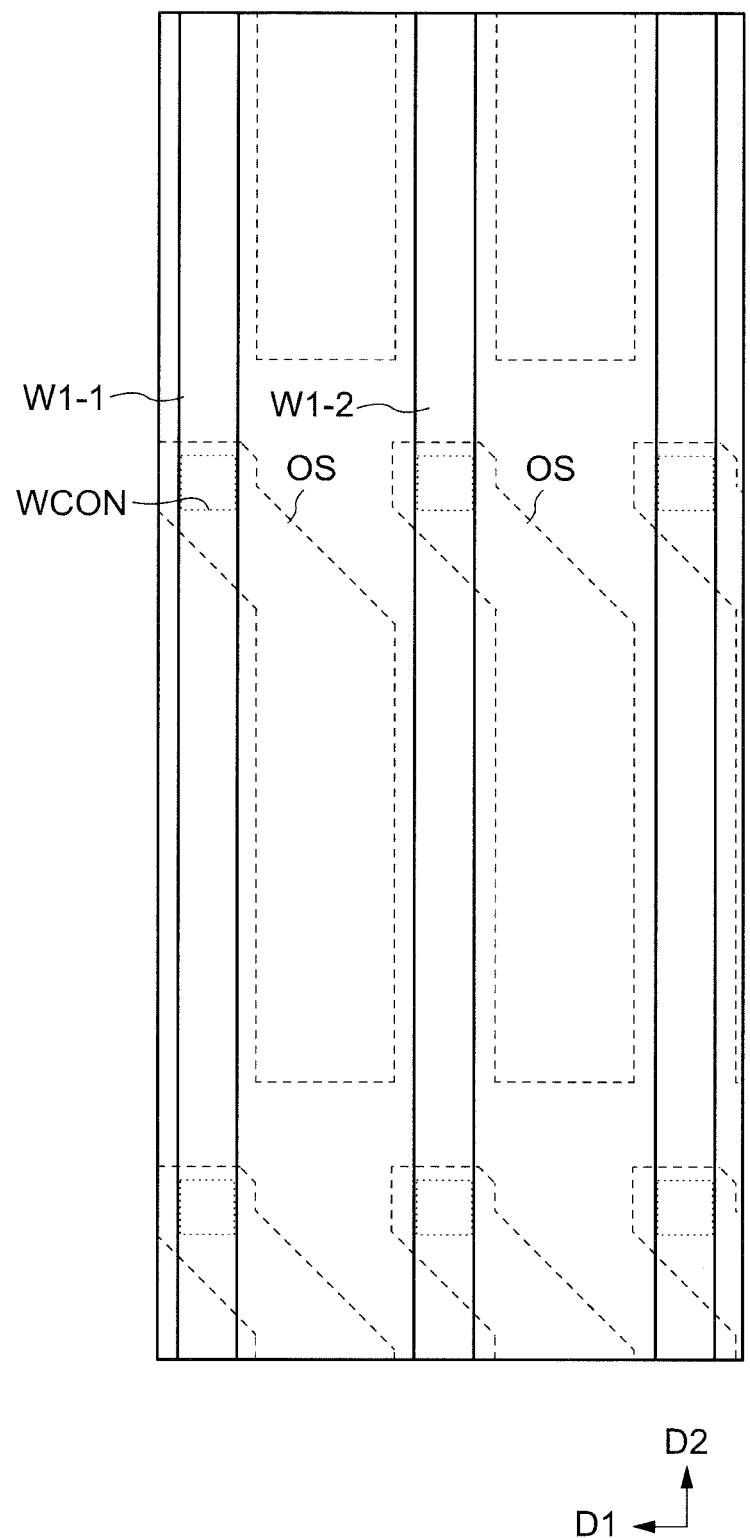
FIG. 7 is a plan view illustrating a layout of one or more layers in a display device according to an embodiment of the present invention.

As shown in FIG. 2, FIG. 6, and FIG. 7, the opening WCON is provided in an area overlapping the wiring W1 near an upper end of the pattern of the oxide semiconductor layer OS. A main part of the pattern of the oxide semiconductor layer OS extends in the direction D2 between a pair of the adjacent wirings W1. The remaining part of the pattern of the oxide semiconductor layer OS extends obliquely in the direction D1 and the direction D2 from the main part and overlaps the opening WCON.

As shown in FIG. 2 and FIG. 7, multiple wirings W1 extend in the direction D2. In the case where the adjacent wirings W1 need to be described separately, the adjacent wiring W1 is referred to as a wiring W1-1 (first pixel wiring) and a wiring W1-2 (second pixel wiring). In this case, it can be said that the main part of the oxide semiconductor layer OS extends in the direction D2 between the first pixel wiring W1-1 and the second pixel wiring W1-2, and intersects the gate electrode GL1. In other words, the oxide semiconductor layer OS is provided in a long shape in the direction D2 (shape having a longitudinal) and connected to the wiring W1-1 at one end in a longitudinal direction of the oxide semiconductor layer OS.

Figure 8:
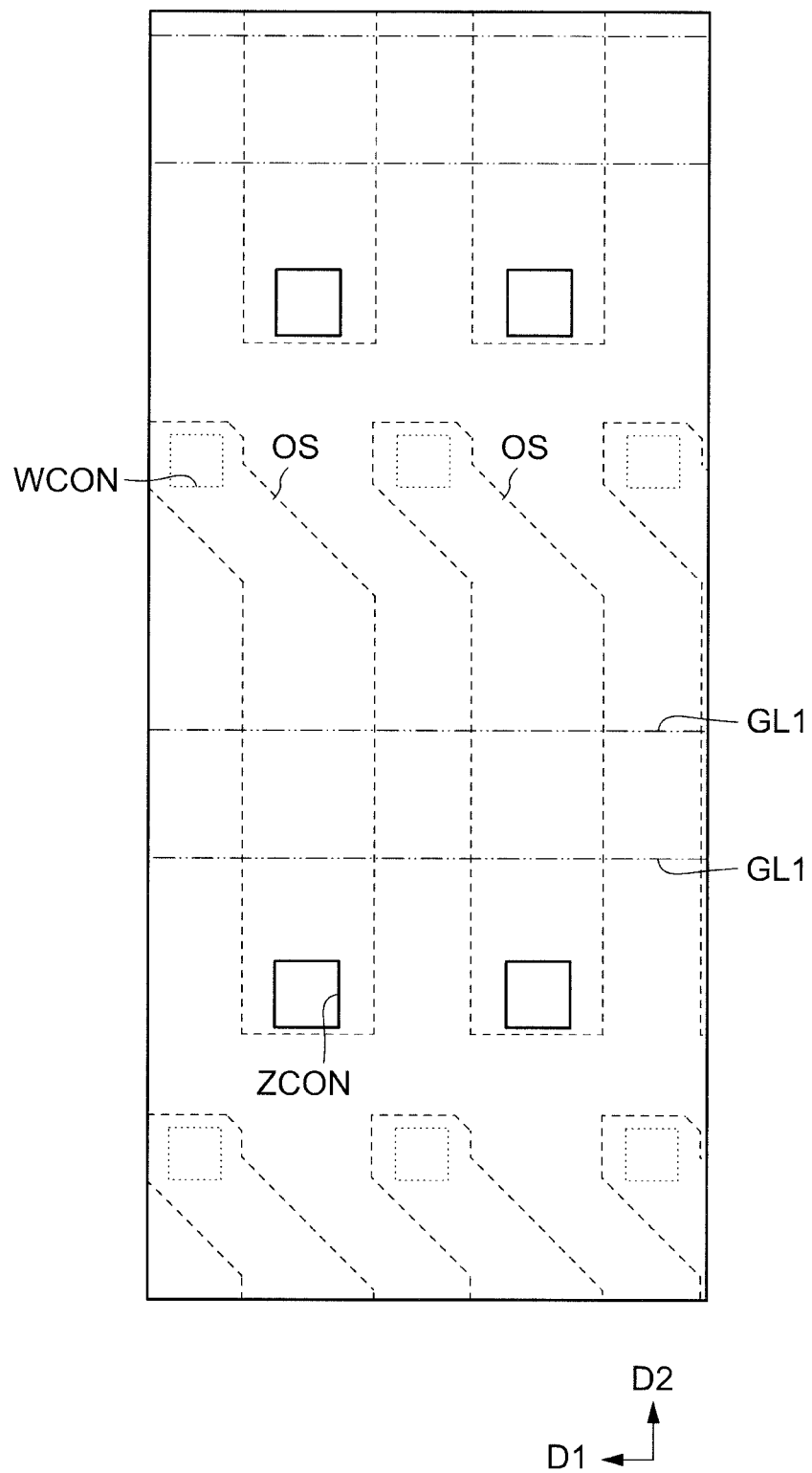
FIG. 8 is a plan view illustrating a layout of one or more layers in a display device according to an embodiment of the present invention.
Figure 9:
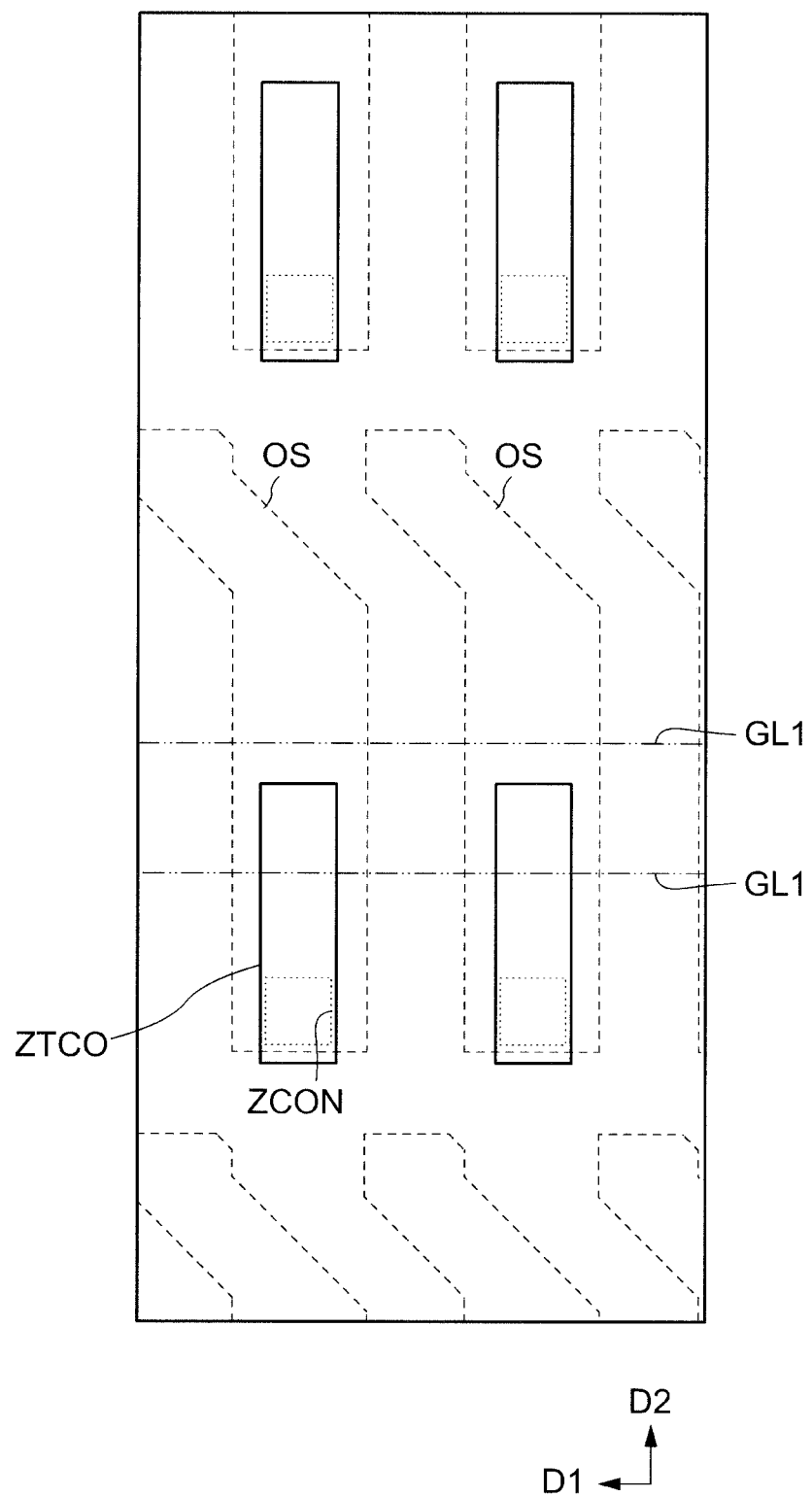
FIG. 9 is a plan view illustrating a layout of one or more layers in a display device according to an embodiment of the present invention.

As shown in FIG. 2, FIG. 8, and FIG. 9, the opening ZCON is provided near a lower end of the pattern of the oxide semiconductor layer OS. The opening ZCON is provided in an area overlapping the pattern of the oxide semiconductor layer OS and not overlapping the gate electrode GL1. The opening ZCON is provided in an area overlapping the connecting electrode ZTCO. The connecting electrode ZTCO overlaps the gate electrode GL1 and the oxide semiconductor layer OS between the wiring W1-1 and the wiring W1-2. Therefore, the connecting electrode ZTCO is in contact with the oxide semiconductor layer OS in the opening ZCON (the first contact area CON1) not overlapping the gate electrode GL1.

In other words, the oxide semiconductor layer OS is connected to the connecting electrode ZTCO (the first transparent conductive layer) at the other end in the longitudinal direction of the oxide semiconductor layer OS. The connecting electrode ZTCO is formed in a long shape extending in the direction D2 similar to the oxide semiconductor layer OS. In the direction D1, a width of the connecting electrode ZTCO is smaller than a width of the oxide semiconductor layer OS.

As shown in FIG. 2, FIG. 7, and FIG. 8, the oxide semiconductor layer OS is in contact with the wiring W1 at the opposite side of the opening ZCON with respect to the gate electrode GL1. The opening ZCON does not overlap the light-shielding layer LS.

Figure 10:
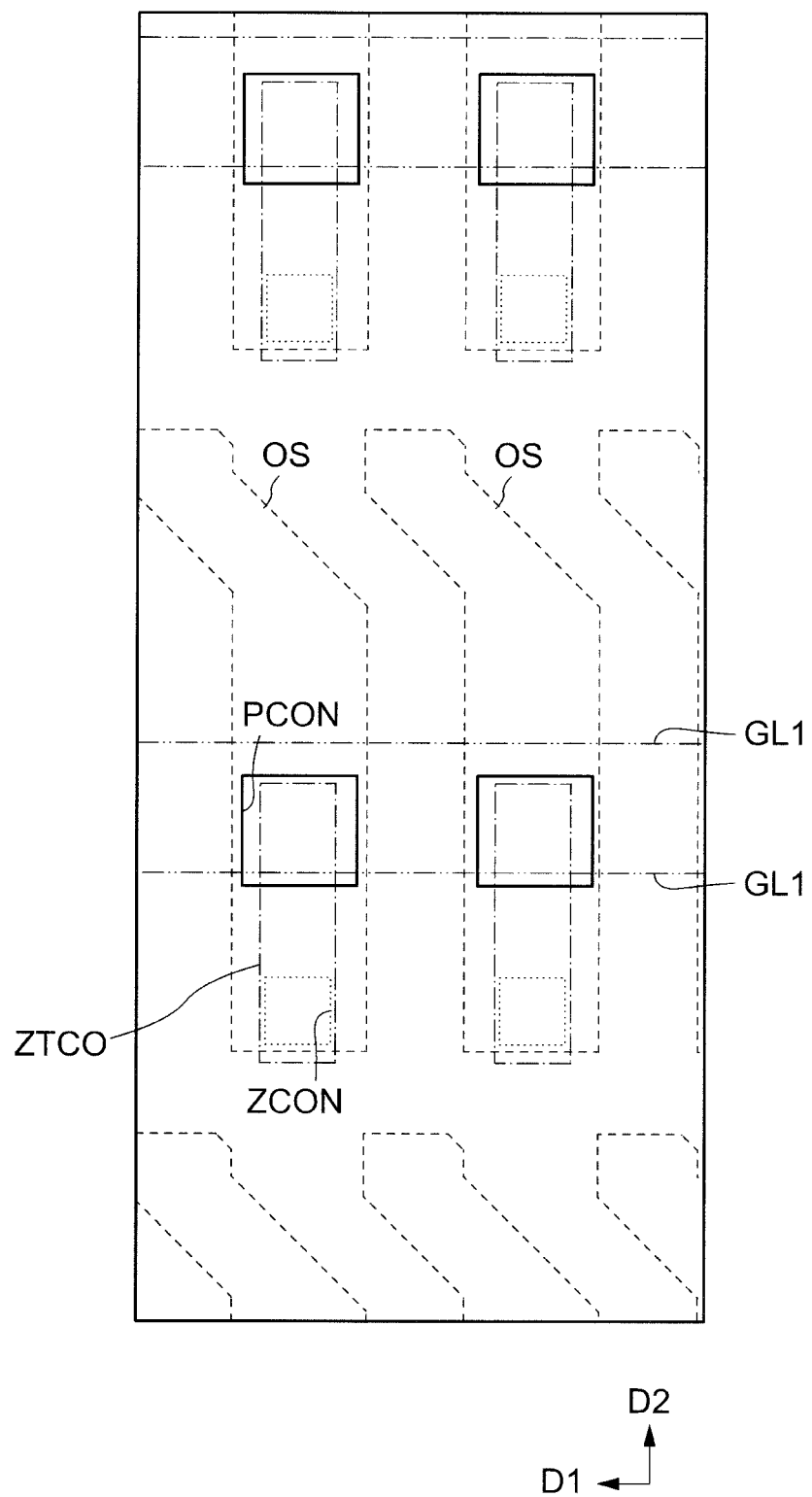
FIG. 10 is a plan view illustrating a layout of one or more layers in a display device according to an embodiment of the present invention.
Figure 11:
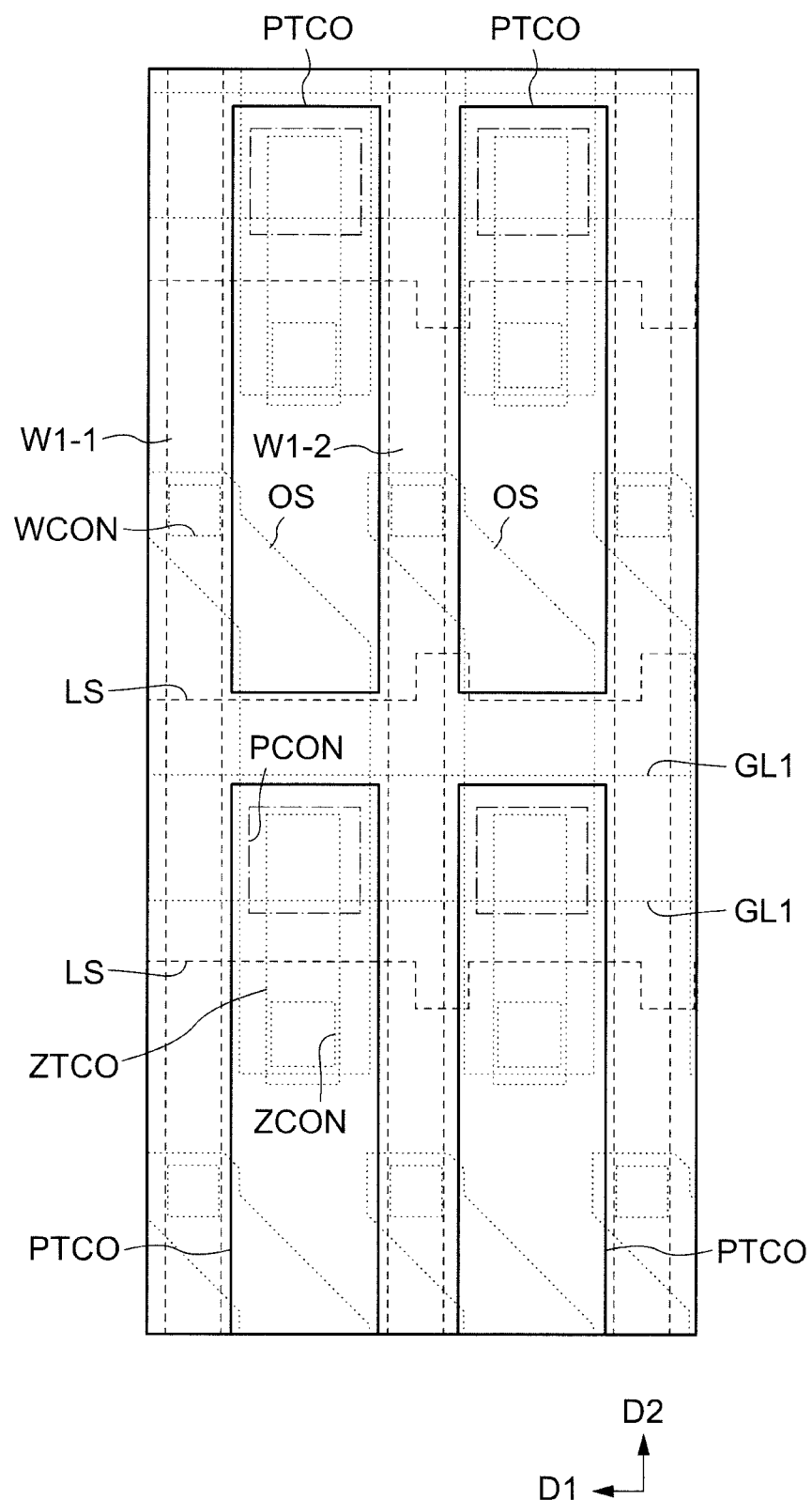
FIG. 11 is a plan view illustrating a layout of one or more layers in a display device according to an embodiment of the present invention.

As shown in FIG. 2, FIG. 10, and FIG. 11, the opening PCON is provided near an upper end of a pattern of the connecting electrode ZTCO. The opening PCON is provided in an area overlapping the pattern of the gate electrode GL1 and the pattern of the connecting electrode ZTCO. The opening PCON is provided in an area overlapping the pixel electrode PTCO. The pixel electrode PTCO overlaps the gate electrode GL1, the oxide semiconductor layer OS, and the connecting electrode ZTCO between the wiring W1-1 and the wiring W1-2. Therefore, the pixel electrode PTCO is in contact with the connecting electrode ZTCO in the opening PCON (the second contact area CON2) overlapping the gate electrode GL1.

The pixel electrode PTCO extends in the translucent area as described below. The pixel electrode PTCO may be referred to as a "second transparent conductive layer". In other words, the pixel electrode PTCO (the second transparent conductive layer) is formed in an elongated shape extending in the direction D2 similar to the oxide semiconductor layer OS and the wiring W1-1 (the first pixel wiring). In the direction D1, a width of the pixel electrode PTCO (the second transparent conductive layer) in a portion where the opening PCON is provided is larger than a width of the oxide semiconductor layer OS.

As shown in FIG. 11, the connecting electrode ZTCO (the first transparent conductive layer) is formed in an elongated shape extending along the wiring W1-1 (the first pixel wiring). In the direction D1, a width of the opening PCON constituting the second contact area CON2 is larger than a width of the connecting electrode ZTCO (the first transparent conductive layer). In a plan view, the entire connecting electrode ZTCO (the first transparent conductive layer) overlaps the pixel electrode PTCO (the second transparent conductive layer).

As shown in FIG. 11, the pixel electrodes PTCO are aligned in the direction D2. Among the pixels adjacent in the direction D2, one of the pixels is referred to as a "first pixel", and another of the pixels is referred to as a "second pixel". For example, the first pixel is a pixel corresponding to the upper pixel electrode PTCO among the pixel electrodes PTCO arranged in the direction D2 in FIG. 11, and the second pixel is a pixel corresponding to the lower pixel electrode PTCO among the pixel electrodes PTCO arranged in the direction D2. In this case, pixel signals are supplied from the wiring W1-1 (the first pixel wiring) to the first pixel and the second pixel.

The pixel electrodes PTCO are aligned in the direction D1. A pixel adjacent in the direction D1 with respect to the first pixel described above is referred to as a "third pixel", and a pixel adjacent in the direction D1 with respect to the second pixel described above is referred to as a "fourth pixel". The third pixel and the fourth pixel are adjacent to each other in the direction D2. Pixel signals are supplied from the wiring W1-2 (the second pixel wiring) adjacent to the wiring W1-1 (the first pixel wiring) to the third pixel and the fourth pixel.

As described above, each of the first pixel, the second pixel, the third pixel, and the fourth pixel has the transistor Tr1 (a pixel transistor), the connecting electrode ZTCO (the first transparent conductive layer), and the pixel electrode PTCO (the second transparent conductive layer).

The transistor Tr1 includes the oxide semiconductor layer OS, the gate electrode GL1 facing the oxide semiconductor layer OS, and the gate insulating layer GI1 between the oxide semiconductor layer OS and the gate electrode GL1. The connecting electrode ZTCO overlaps the gate electrode GL1 and the oxide semiconductor layer OS in a plan view, and is in contact with the oxide semiconductor layer OS in the opening ZCON (the first contact area CON1) which does not overlap the gate electrode GL1. The pixel electrode PTCO overlaps the gate electrode GL1, the oxide semiconductor layer OS, and the connecting electrode ZTCO in a plan view, and is connected to the connecting electrode ZTCO in the opening PCON (the second contact area CON2) which overlaps the gate electrode GL1.

In a plan view, the pixel electrode PTCO of the first pixel provided in an upper side of FIG. 11 overlaps the oxide semiconductor layer OS of the first pixel and the oxide semiconductor layer OS of the second pixel provided in a lower side of the first pixel. The pixel electrode PTCO of the first pixel overlaps the oxide semiconductor layer OS of the fourth pixel in a plan view.

As shown in FIG. 12, the common auxiliary electrode CMTL is provided in a grid shape so as to surround the periphery of a pixel area. That is, the common auxiliary electrode CMTL is provided commonly for multiple pixels. In other words, the common auxiliary electrode CMTL has an opening OP. The opening OP is provided to expose the pixel electrode PTCO. A pattern of the opening OP is provided inside the pattern of the pixel electrode PTCO. An area provided with the opening OP corresponds to a display area. That is, the opening ZCON is included in the display area. The display area means an area in which a user can see light from a pixel. For example, a frame area that is shielded by a metal layer and unperceivable to the user is not included in the display area. That is, the above display area may be referred to as a "translucent area (or opening area)".

As shown in FIG. 13, the common electrode CTCO is provided commonly for multiple pixels. A slit SL is provided in an area corresponding to the above opening OP. The slit SL has a curved shape (longitudinally long S-shape). A tip of the slit SL has a shape in which a width orthogonal to an extending direction of the tip is reduced. Referring to FIG. 1A and FIG. 13, the common electrode CTCO has the slit SL at a position facing the pixel electrode PTCO.

1-6. Materials of Each Member of Display Device 10

A rigid substrate having light transmittance and no flexibility, such as a glass substrate, a silica substrate, and a sapphire substrate can be used as the substrate SUB. On the other hand, in the case where the substrate SUB needs to have flexibility, a flexible substrate containing a resin and having flexibility, such as a polyimide substrate, an acrylic substrate, a siloxane substrate, or a fluororesin substrate can be used as the substrate SUB. In order to improve the heat resistance of the substrate SUB, impurities may be introduced into the above resin.

General metal materials can be used as the gate electrode GL2, the wirings W1, W2, the light-shielding layer LS, and the common auxiliary electrode CMTL. For example, aluminum (Al), titanium (Ti), chromium (Cr), cobalt (Co), nickel (Ni), molybdenum (Mo), hafnium (Hf), tantalum (Ta), tungsten (W), bismuth (Bi), and silver (Ag), or alloys or compounds thereof are used as members of these electrodes and the like. The above materials may be used in a single layer or a stacked layer as the members of the above electrodes and the like.

General insulating materials can be used as the gate insulating layers GI1, GI2, and the insulating layers IL1 to IL5. For example, inorganic insulating layers such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), aluminum nitride ($AlN_x$), and the like can be used as the insulating layers IL1 to IL3, and IL5. Low-defect insulating layers can be used as these insulating layers. Organic insulating materials such as a polyimide resin, an acrylic resin, an epoxy resin, a silicone resin, a fluororesin, or a siloxane resin can be used as the insulating layer IL4. The above organic insulating materials may be used as the gate insulating layers GI1, GI2, and the insulating layers IL1 to IL3, IL5. The above materials may be used in a single layer or a stacked layer as a member of the insulating layer and the like.

$SiO_x$ with a thickness of 100 nm is used as the gate insulating layer GI1 as an example of the above insulating layer. $SiO_x/SiN_x/SiO_x$ with a total thickness of 600 nm to 700 nm is used as the insulating layer IL1. $SiO_x/SiN_x$ with a total thickness of 60 nm to 100 nm is used as the gate insulating layer GI2. $SiO_x/SiN_x/SiO_x$ with a total thickness of 300 nm to 500 nm is used as the insulating layer IL2. $SiO_x$ with a total thickness of 200 nm to 500 nm (single layer), $SiN_x$ (single layer), or a stacked layer thereof is used as the insulating layer IL3. The organic layer with a thickness of 2 μm to 4 μm is used as the insulating layer IL4. $SiN_x$ (single layer) with a thickness of 50 nm to 150 nm is used as the insulating layer IL5.

The above $SiO_xN_y$ and $AlO_xN_y$ are silicone compounds and aluminum compounds containing nitrogen (N) in a smaller ratio (x>y) than oxygen (O). The above $SiN_xO_y$ and $AlN_xO_y$ are silicon compounds and aluminum compounds containing oxygen in a smaller ratio (x>y) than nitrogen.

A metal oxide having semiconductor characteristics can be used as the oxide semiconductor layer OS. The oxide semiconductor layer OS has light transmittance. For example, an oxide semiconductor containing indium (In), gallium (Ga), zinc (Zn), and oxygen (O) can be used as the oxide semiconductor layer OS. In particular, an oxide semiconductor having a composition ratio of In:Ga:Zn:O=1:1:1:4 can be used. However, the oxide semiconductor containing In, Ga, Zn, and O used in the present embodiment is not limited to the above composition, and an oxide semiconductor having a composition different from that described above can also be used. For example, the ratio of In may be larger than that described above to improve mobility. The ratio of Ga may be larger to increase the band gap and reduce the influence of light irradiation.

Other elements may be added to the oxide semiconductor containing In, Ga, Zn, and O. For example, a metal element such as Al or Sn may be added to the oxide semiconductor. In addition to the oxide semiconductor described above, an oxide semiconductor containing In and Ga (IGO), an oxide semiconductor containing In and Zn (IZO), an oxide semiconductor containing In, Sn, and Zn (ITZO), and an oxide semiconductor containing In and W may be used as the oxide semiconductor layer OS. The oxide semiconductor layer OS may be amorphous or crystalline. The oxide semiconductor layer OS may be a mixed phase of amorphous and crystalline.

A transparent conductive layer is used as the connecting electrode ZTCO, the pixel electrode PTCO, and the common electrode CTCO. A mixture of indium oxide and tin oxide (ITO) and a mixture of indium oxide and zinc oxide (IZO) can be used as the transparent conductive layer. Materials other than the above may be used as the transparent conductive layer.

As described above, in a display device 10 according to the present embodiment, the first conductive layer 110 which has hydrogen storage properties is used as the gate electrode GL1. Therefore, for example, hydrogen released from the gate insulating layer GI1, the insulating layers IL1, IL2, or the like is stored in the first conductive layer 110. Consequently, since hydrogen that may reduce the oxide semiconductor layer OS can be reduced particularly around the oxide semiconductor layer, fluctuations in the electrical characteristic of the transistor Tr1 are suppressed.

In particular, in the case where the transistor Tr1 in which an oxide semiconductor layer is used for a channel and a transistor Tr2 in which a semiconductor layer made of polysilicon is used for a channel are formed on the same substrate, a silicon nitride layer containing a large amount of hydrogen in its film is used to improve the characteristic of the transistor Tr2. When the hydrogen emitted from the silicon nitride layer reaches the oxide semiconductor layer of the transistor Tr1, the electrical characteristic of the transistor Tr1 is changed. However, according to the configuration according to the present embodiment, even in such a case, since the first conductive layer 110 absorbs hydrogen, it is possible to suppress fluctuations in the electrical characteristic of the transistor Tr1 as described above.

Since each conductive layer included in the gate electrode GL1 has a tapered shape, the deterioration of the coverage of the insulating layer IL2 in an area where the insulating layer IL2 gets over the gate electrode GL1 is suppressed. Consequently, it is possible to suppress problems such as disconnection of the conductive layers formed on the insulating layer IL2. Therefore, a highly reliable display device can be realized.

1-7. Modifications of Display Device 10

A modification of the display device 10 will be described with reference to FIG. 18 to FIG. 21. FIG. 18 to FIG. 21 are circuit diagrams showing a pixel circuit of a display device according to an embodiment of the present invention. Although the gate electrode GL1 of this modification is similar to the gate electrode GL1 in FIG. 1B, the layer structure of both is different.

1-7-1. Modification 1

Figure 18:
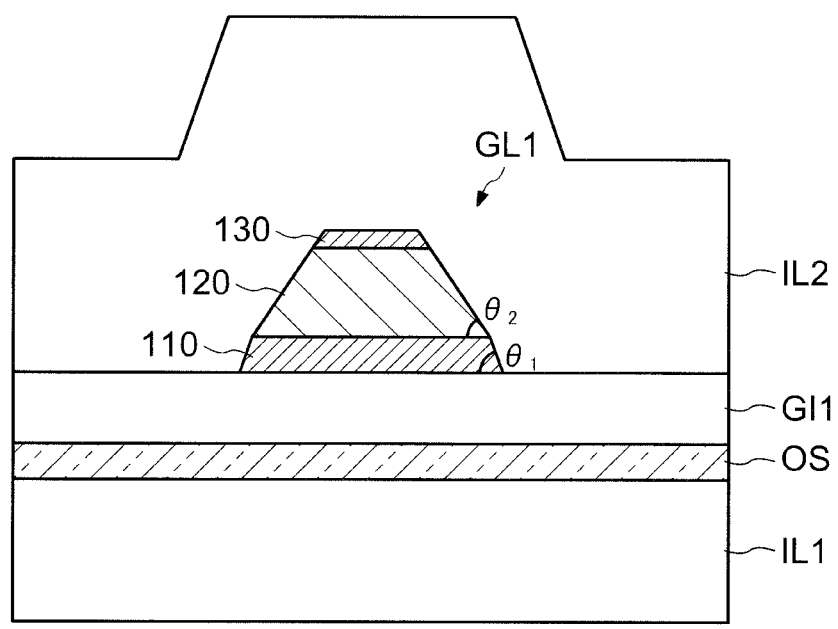
FIG. 18 is a cross-sectional view showing a structure of a transistor according to an embodiment of the present invention.

As shown in FIG. 18, in Modification 1, a thickness of the third conductive layer 130 provided at a position farther from the oxide semiconductor layer OS than the first conductive layer 110 is smaller than a thickness of the first conductive layer 110. The thickness of the third conductive layer 130 is ½ or less or ⅓ or less of the thickness of the first conductive layer 110. With the above-described configuration, when the gate electrode GL1 is dry-etched, the taper angle $\theta_2$ of the second conductive layer 120 (e.g., Al) can be reduced as compared with the case where the thickness of the third conductive layer 130 is the same as the thickness of the first conductive layer 110 (1B in FIG. 3). That is, the taper angle $\theta_2$ of the second conductive layer 120 shown in FIG. 18 can be smaller than the taper angle $\theta$ of the second conductive layer 120 shown in FIG. 1B. As a result, the coverage of the insulating layer IL2 formed on the gate electrode GL1 can be improved. Although a configuration in which the taper angle $\theta_2$ of the second conductive layer 120 is smaller ($\theta_2<\theta_1$) than the taper angle $\theta_1$ of the first conductive layer 110 has been shown in FIG. 18, it is not limited to this configuration. The taper angle $\theta_1$ of the first conductive layer 110 may be the same as the taper angle $\theta_2$ of the second conductive layer 120 ($\theta_2=\theta_1$) and the taper angle $\theta_1$ of the first conductive layer 110 may be smaller than the taper angle $\theta_2$ of the second conductive layer 120 ($\theta_1<\theta_2$).

1-7-2. Modification 2

Figure 19:
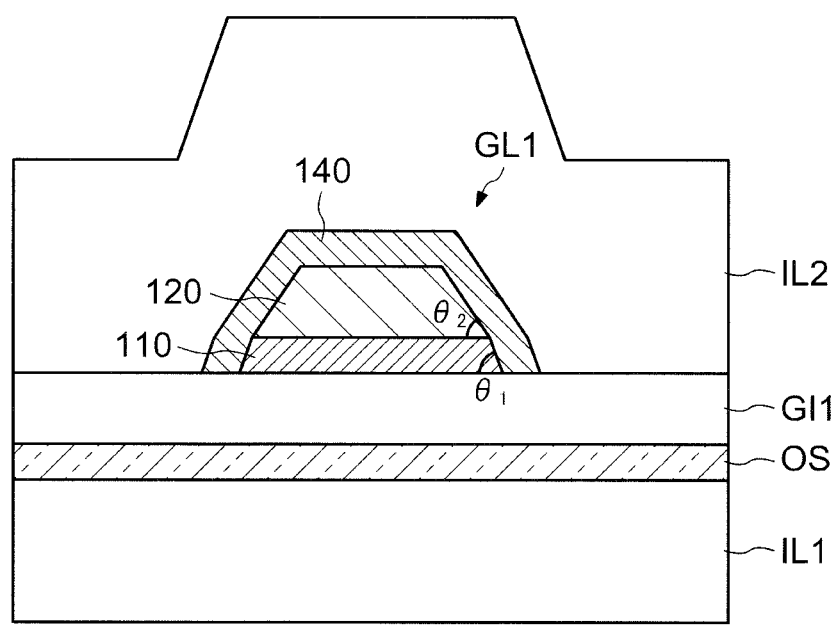
FIG. 19 is a cross-sectional view showing a structure of a transistor according to an embodiment of the present invention.

As shown in FIG. 19, in Modification 2, a fourth conductive layer 140 is provided in place of the third conductive layer 130. The fourth conductive layer 140 is in contact with an upper surface and side surfaces of the second conductive layer 120. Further, the fourth conductive layer 140 is in contact with the side surfaces of the first conductive layer 110 and the gate insulating layer GI1. Similar to the first conductive layer 110 and the third conductive layer 130, a material having hydrogen storage properties is used as the fourth conductive layer 140. To form this structure, after forming the patterns of the first conductive layer 110 and second conductive layer 120, the fourth conductive layer 140 is deposited, and then a pattern of the fourth conductive layer 140 is formed. That is, since the second conductive layer 120 is positioned at the uppermost layer when the second conductive layer 120 is processed, the taper angle $\theta_2$ of the second conductive layer 120 can be smaller than the taper angle $\theta_1$ of the first conductive layer 110. Consequently, the coverage of the insulating layer IL2 formed on the gate electrode GL1 can be improved. As in Modification 1, the taper angle $\theta_1$ of the first conductive layer 110 may be the same as the taper angle $\theta_2$ of the second conductive layer 120, and the taper angle $\theta_1$ of the first conductive layer 110 may be smaller than the taper angle $\theta_2$ of the second conductive layer 120.

In the case where Al is used as the second conductive layer 120, a process of removing a natural oxide film formed on the surface of the second conductive layer 120 may be provided before forming the fourth conductive layer 140. For example, in the case where the fourth conductive layer 140 is formed by a sputtering method, the natural oxide film may be removed by performing a reverse sputtering treatment on the surface of the second conductive layer 120 before forming the fourth conductive layer 140.

1-7-3. Modification 3

Figure 20:
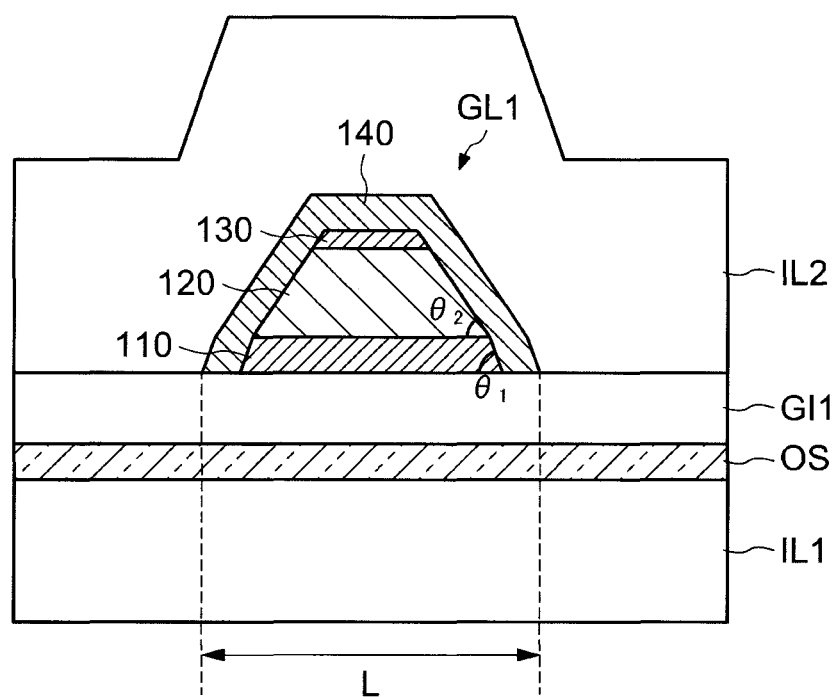
FIG. 20 is a cross-sectional view showing a structure of a transistor according to an embodiment of the present invention.

As shown in FIG. 20, Modification 3 shows a configuration in which the fourth conductive layer 140 is formed on the Modification 1 (FIG. 18). That is, in Modification 3, the fourth conductive layer 140 is in contact with the upper surface and the side surfaces of the third conductive layer 130. Further, the fourth conductive layer 140 is in contact with the side surfaces of each of the first conductive layer 110 and the second conductive layer 120 and the gate insulating layer GI1. To form this structure, after forming the patterns of the first conductive layer 110 to the third conductive layer 130, the fourth conductive layer 140 is deposited to form the pattern. Also in Modification 3, the coverage of the insulating layer IL2 formed on the gate electrode GL1 can be improved as in Modification 1. In such a configuration, it is needless to say that a channel length of the oxide semiconductor layer OS is defined by a distance L between the outer ends of the fourth conductive layer 140. That is, two types of electrically connected conductive layers, the first conductive layer 110 and the fourth conductive layer 140, face the oxide semiconductor OS from the same direction via the gate insulating layer GI1, and these constitute one gate electrode.

1-7-4. Modification 4

Figure 21:
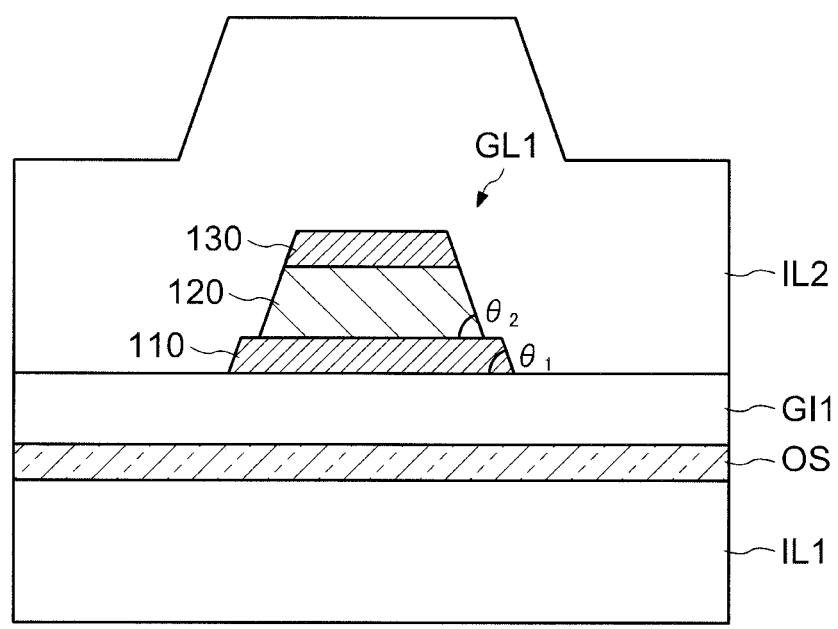
FIG. 21 is a cross-sectional view showing a structure of a transistor according to an embodiment of the present invention.

As shown in FIG. 21, in Modification 4, a part of the upper surface of the first conductive layer 110 is exposed from the second conductive layer 120. That is, an upper end of the side surface of the first conductive layer 110 does not coincide with a lower end of the side surface of the second conductive layer 120, and in a plan view, the lower end of the side surface of the second conductive layer 120 is located inside the upper end of the side surface of the first conductive layer 110. The taper angle $\theta_2$ of the second conductive layer 120 is equal to the taper angle $\theta_1$ of the first conductive layer 110. As described above, since a part of the upper surface of the first conductive layer 110 having hydrogen storage properties is exposed from the second conductive layer 120, the area of the surface of the first conductive layer 110 that can store hydrogen can be increased. In the example of FIG. 21, although the configuration in which the upper end of the side surface of the second conductive layer 120 coincides with the lower end of the side surface of the third conductive layer 130 has been exemplified, the present invention is not limited to this configuration. The taper angle $\theta_2$ of the second conductive layer 120 may be different from the taper angle $\theta_1$ of the first conductive layer 110.

1-7-5. Modification 5

Figure 22:
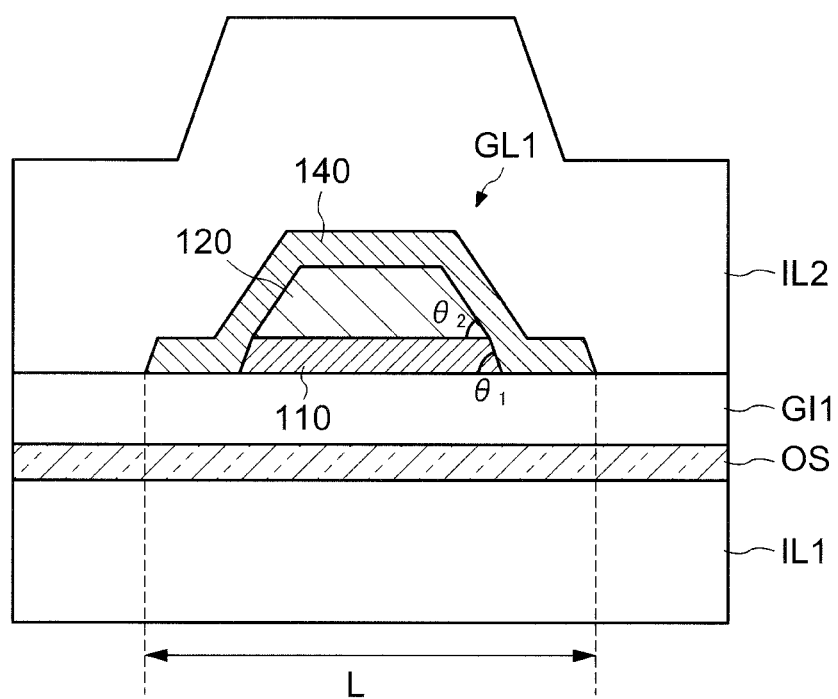
FIG. 22 is a cross-sectional view showing a structure of a transistor according to an embodiment of the present invention.

As shown in FIG. 22, although Modification 5 is similar to the structure of Modification 2 (FIG. 19), it is different from Modification 2 in the structure of the fourth conductive layer 140. Specifically, in Modification 5, the fourth conductive layer 140 extends outward from the end of the first conductive layer 110. In other words, in the area that does not overlap the first conductive layer 110 in a plan view, both the lower and upper surfaces of the fourth conductive layer 140 in a cross-sectional view are parallel to the upper surface of the gate insulating layer GI1. In this configuration, the channel length of the oxide semiconductor layer OS is defined by the distance L between the outer ends of the fourth conductive layer 140.

1-7-6. Modification 6

Figure 23:
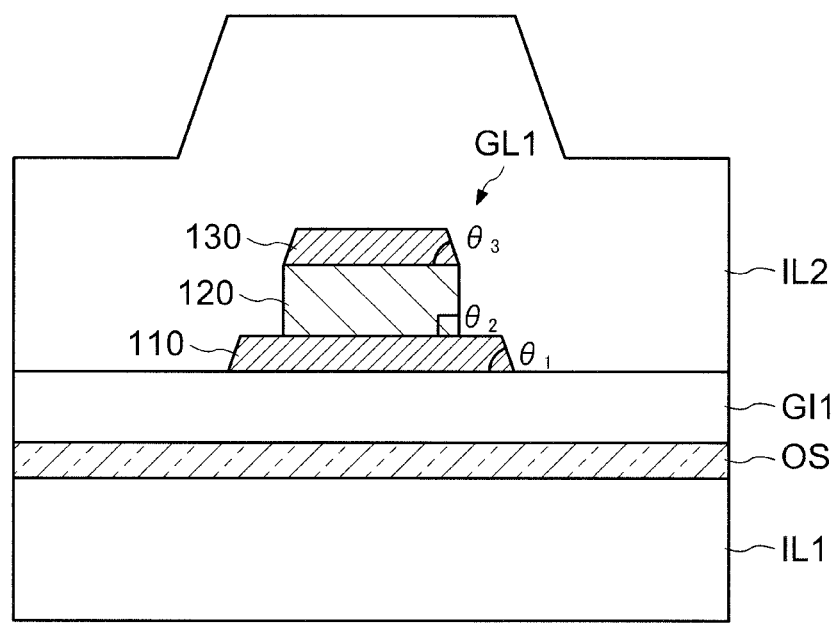
FIG. 23 is a cross-sectional view showing a structure of a transistor according to an embodiment of the present invention.

As shown in FIG. 23, although Modification 6 is similar to the structure of Modification 4 (FIG. 21), it is different from Modification 4 in the structure of the second conductive layer 120. Specifically, in a pattern end of the second conductive layer 120, it is different from Modification 4 in that the angle $\theta_2$ formed by the lower surface and the side surface of the second conductive layer 120 is a substantially right angle, and that the area of a part of the upper surface of the first conductive layer 110 is not covered by the second conductive layer 120 and the upper surface of the first conductive layer 110 is in contact with the insulating layer IL2 in area.

In Modification 6, the taper angle $\theta_2$ of the second conductive layer 120 is larger than the taper angle $\theta_1$ of the first conductive layer 110 and a taper angle $\theta_3$ of the third conductive layer 130. The taper angle $\theta_1$ of the first conductive layer 110 may be the same as or different from the taper angle $\theta_3$ of the third conductive layer 130. The taper angle $\theta_2$ of the second conductive layer 120 need not be strictly at a right angle (90°), but may be substantially at a right angle. For example, the taper angle of the second conductive layer 120 may be 85° or more and 95° or less.

1-7-7. Modification 7

Figure 24:
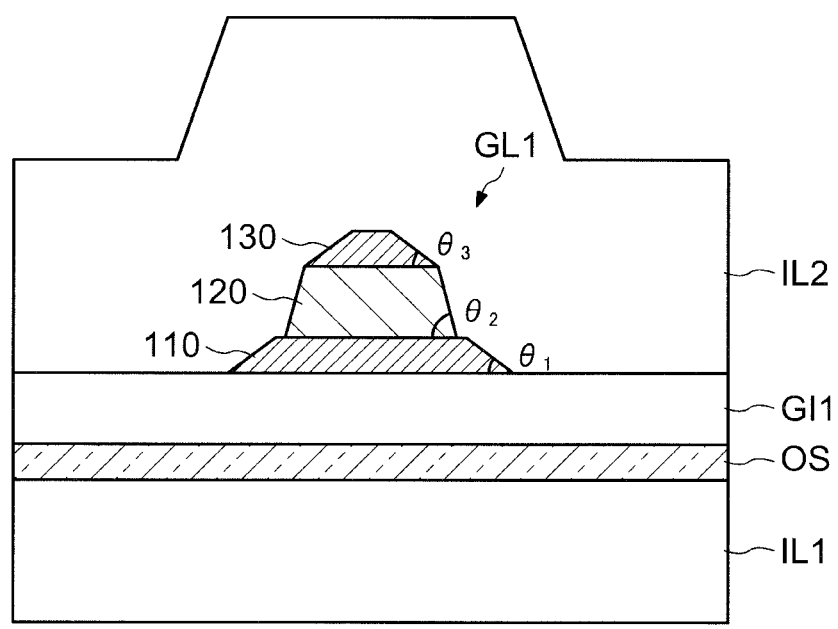
FIG. 24 is a cross-sectional view showing a structure of a transistor according to an embodiment of the present invention.

As shown in FIG. 24, although Modification 7 is similar to the structure of Modification 6 (FIG. 23), it is different from Modification 6 in the taper angle $\theta_1$ to taper angle $\theta_3$. In Modification 7, the taper angle $\theta_2$ is a sharp angle. Further, the taper angle $\theta_1$ and the taper angle $\theta_3$ are smaller angles than the taper angle $\theta_2$. The taper angle $\theta_1$ and the taper angle $\theta_3$ are substantially the same. The taper angle $\theta_1$ may be different from the taper angle $\theta_3$. That is, a configuration of $\theta_1 > \theta_3$ or $\theta_1 < \theta_3$ can be employed. Although FIG. 24 exemplified a configuration in which all of the upper surfaces of the second conductive layer 120 are covered by the third conductive layer 130, it is not limited to this configuration. A part of the upper surface of the second conductive layer 120 is not covered by the third conductive layer 130, and in that area, the upper surface of the second insulating layer 120 may be in contact with the insulating layer IL2.

1-7-8. Modification 8

Figure 25:
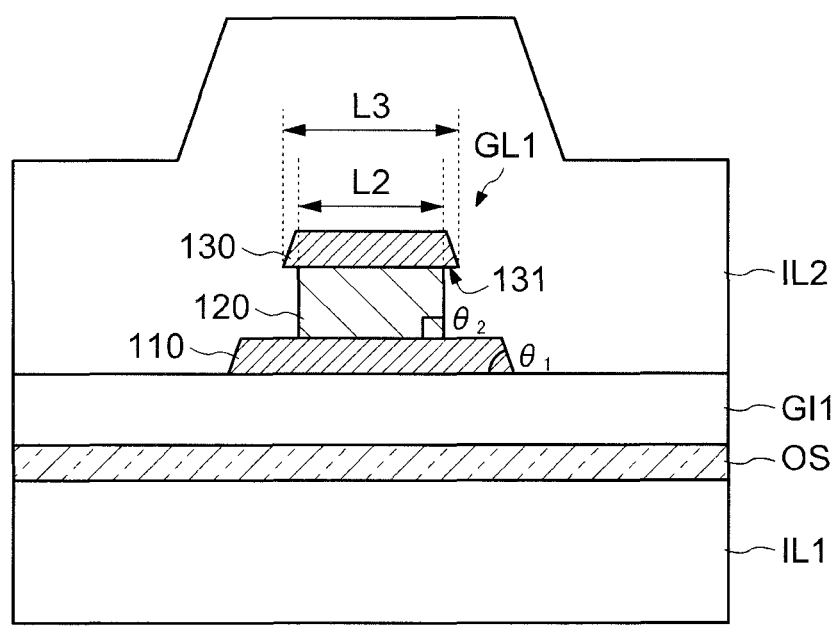
FIG. 25 is a cross-sectional view showing a structure of a transistor according to an embodiment of the present invention.

As shown in FIG. 25, although Modification 8 is similar to the structure of Modification 6 (FIG. 23), it is different from Modification 6 in the structure of the second conductive layer 120 and the third conductive layer 130. Specifically, the distance L2 between the outer ends of the second conductive layer 120 is smaller than a distance L3 between the outer ends of the third conductive layer 130. Consequently, a lower surface 131 is not in contact with the second conductive layer 120 in the area of a part of the third conductive layer 130. In FIG. 25, although the configuration in which the lower surface 131 is in contact with the insulating layer IL2 is exemplified, it is not limited to this configuration. For example, the lower surface 131 may not be in contact with the insulating layer IL2. That is, the insulating layer IL2 may not be formed in the vicinity of the lower surface 131, and a cavity may be formed.

Figure 26:
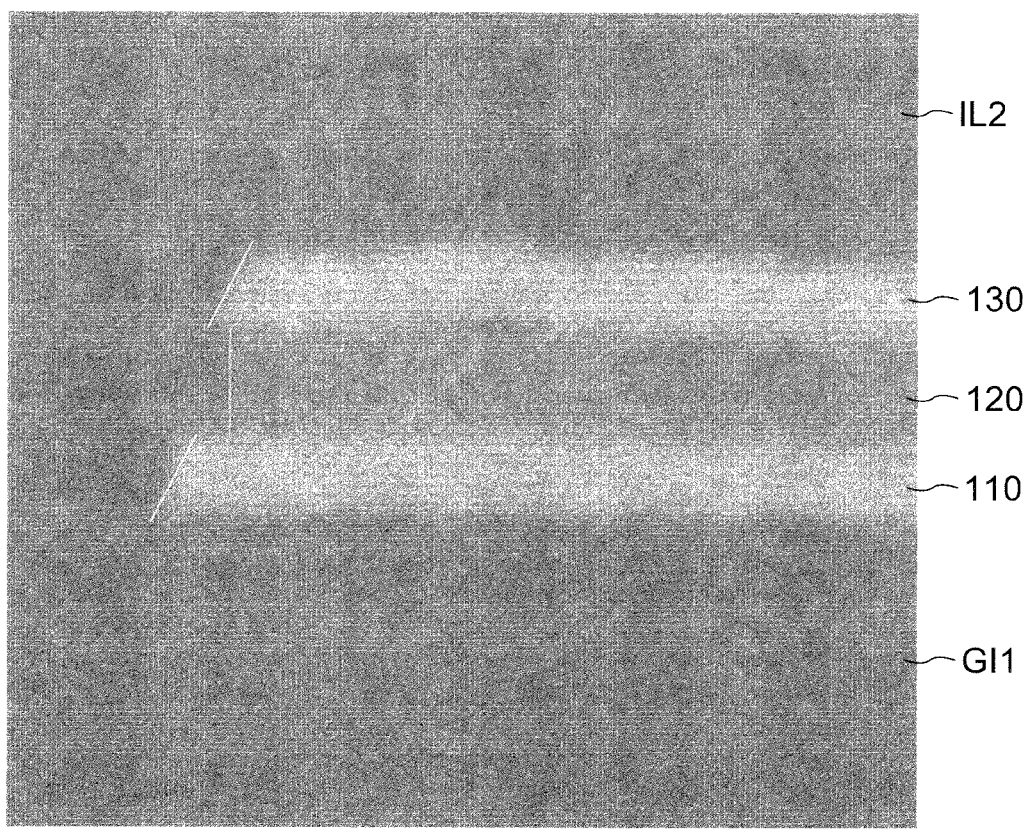
FIG. 26 is a cross-sectional photograph of a transistor according to an embodiment of the present invention.

FIG. 26 is a cross-sectional photograph of a transistor according to an embodiment of the present invention (cross-sectional TEM image). In FIG. 26, the gate insulating layer GI1, the first conductive layer 110, the second conductive layer 120, the third conductive layer 130, and the insulating layer IL2 are enlarged and displayed. In the cross-sectional photograph shown in FIG. 26, shapes of each end of the first conductive layer 110, the second conductive layer 120, and the third conductive layer 130 are shown by dotted lines. The structure shown in the cross-sectional photograph of FIG. 26 has the same configuration as the structure shown in FIG. 25.

2. Second Embodiment

Figure 14:
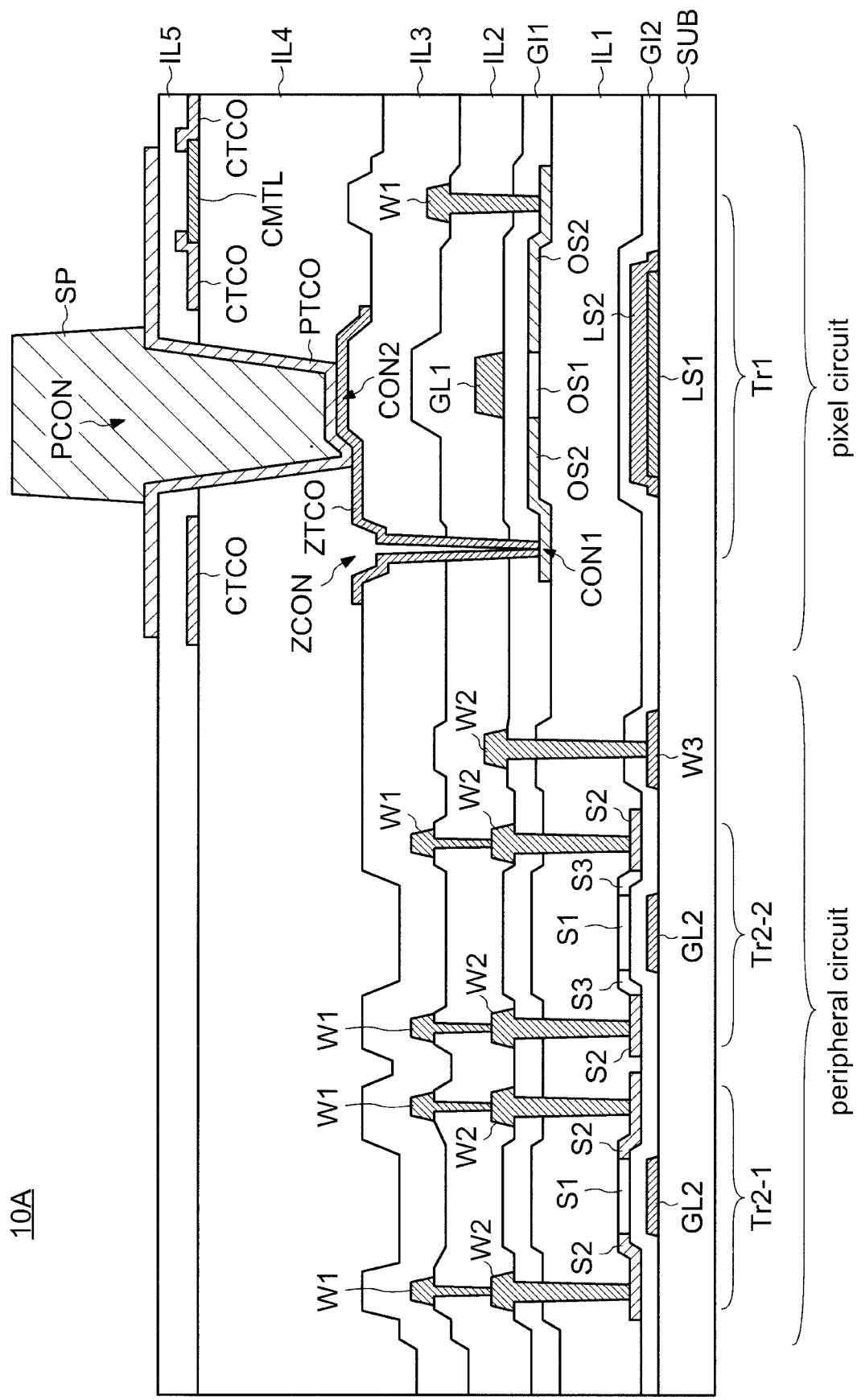
FIG. 14 is a cross-sectional view showing an outline of a display device according to an embodiment of the present invention.

A configuration of a display device 10A according to an embodiment of the present invention will be described with reference to FIG. 14. FIG. 14 is a cross-sectional view showing an outline of a display device according to an embodiment of the present invention. Although the display device 10A shown in FIG. 14 is similar to the display device 10 shown in FIG. 1A, the positional relationship between the pixel electrode PTCO and the common electrode CTCO is different.

As shown in FIG. 14, the common auxiliary electrode CMTL and the common electrode CTCO are provided above the insulating layer IL4. The insulating layer IL5 is provided above the common auxiliary electrode CMTL and the common electrode CTCO. The pixel electrode PTCO is provided above the insulating layer IL5. The pixel electrode PTCO is connected to the connecting electrode ZTCO via the opening PCON provided in the insulating layers IL4 and IL5. As described above, the pixel electrode PTCO may be provided above the common electrode CTCO.

According to the display device 10A of the present embodiment, the same effects as those of the display device 10 of the first embodiment can be obtained.

3. Third Embodiment

An entire configuration of the display device described in the first embodiment and the second embodiment will be described with reference to FIG. 15 to FIG. 17.

3-1. Outline of Display Device 20B

Figure 15:
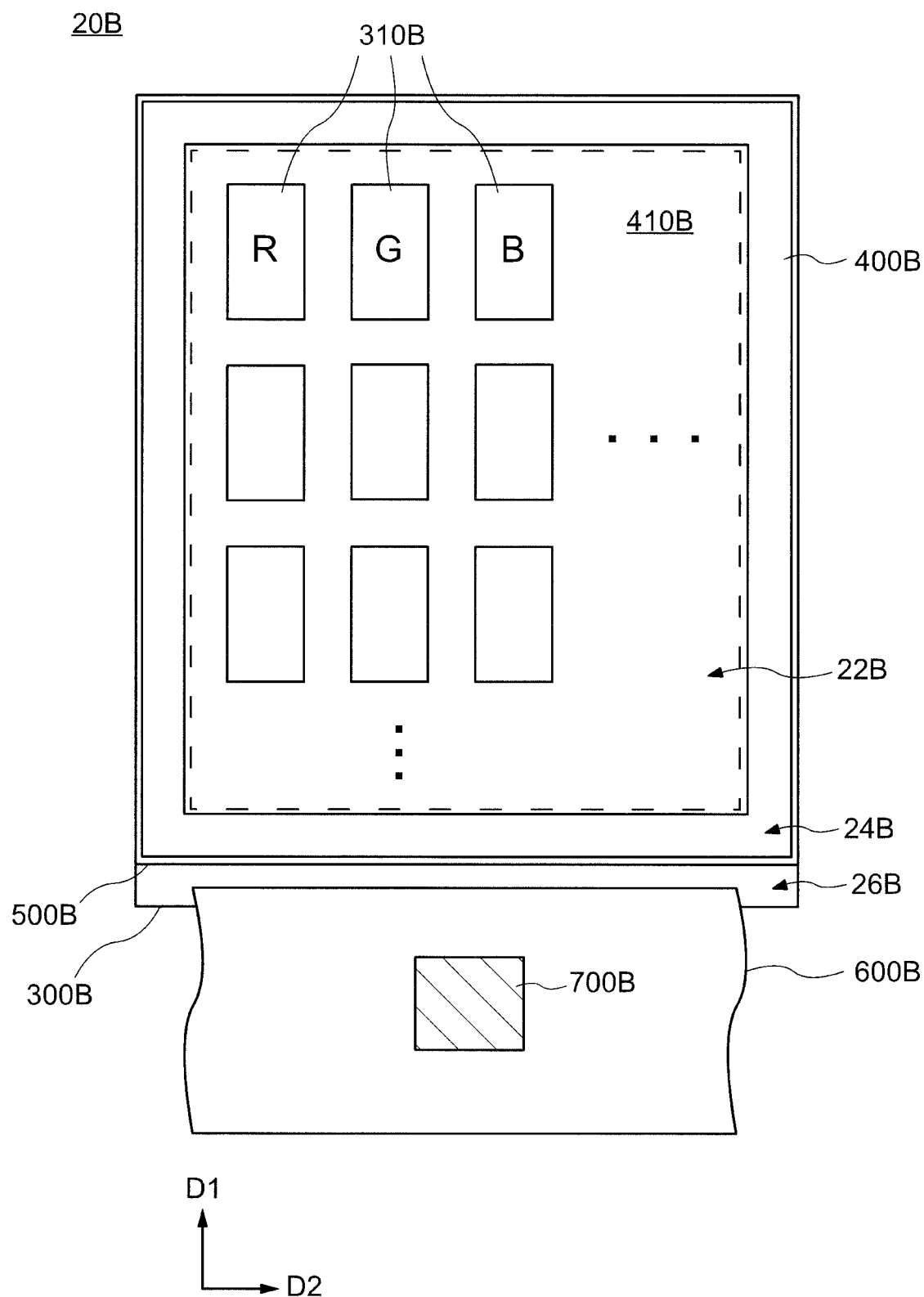
FIG. 15 is a plan view showing an outline of a display device according to an embodiment of the present invention.

FIG. 15 is a plan view showing an outline of a display device according to an embodiment of the present invention. As shown in FIG. 15, a display device 20B includes an array substrate 300B, a seal part 400B, a counter substrate 500B, a flexible printed circuit board 600B (FPC 600B), and an IC chip 700B. The array substrate 300B and the counter substrate 500B are bonded by the seal part 400B. Multiple pixel circuits 310B are arranged in a matrix in a liquid crystal area 22B surrounded by the seal part 400B. The liquid crystal area 22B is an area overlapping a liquid crystal element 410B described later in a plan view. The liquid crystal area 22B is an area configured to contribute to a display. The liquid crystal area 22B may be referred to as a "display area". The transistor Tr1 (first transistor) is provided in the liquid crystal area 22B (display area).

A seal area 24B provided with the seal part 400B is an area around the liquid crystal area 22B. The FPC 600B is provided in a terminal area 26B. The terminal area 26B is an area where the array substrate 300B is exposed from the counter substrate 500B and provided outside the seal area 24B. The exterior side of the seal area means outside the area provided with the seal part 400B and outside the area surrounded by the seal part 400B. The IC chip 700B is provided on the FPC 600B. The IC chip 700B supplies a signal for driving each pixel circuit 310B. The seal area 24B or an area combined with the seal area 24B and the terminal area 26B is an area that surrounds the liquid crystal area 22B (display area). These areas may be referred to as a "frame area". The transistor Tr2 (the second transistor) is provided in the frame area.

3-2. Circuit Configuration of Display Device 20B

Figure 16:
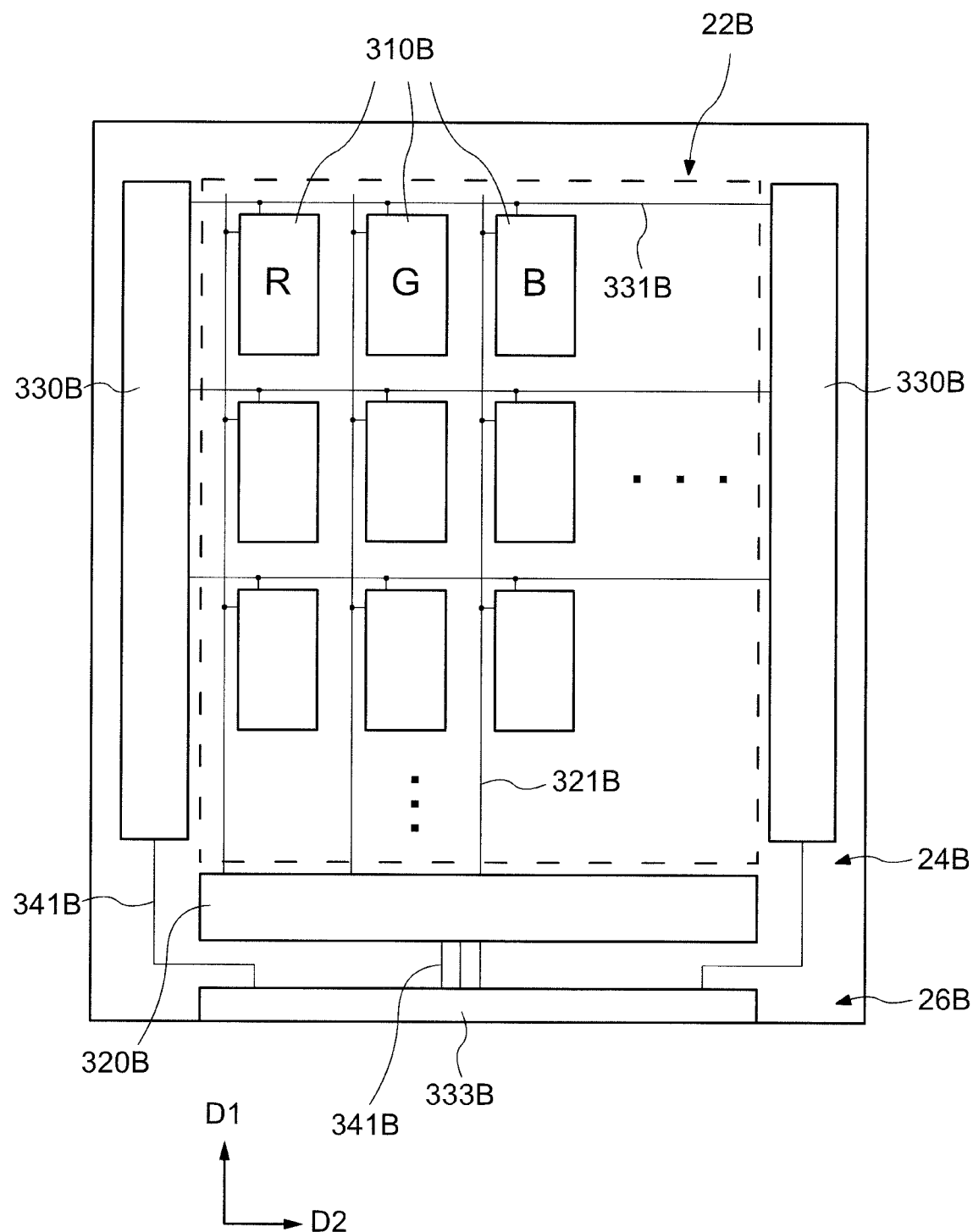
FIG. 16 is a block diagram showing a circuit configuration of a display device according to an embodiment of the present invention.

FIG. 16 is a block diagram showing a circuit configuration of a display device according to an embodiment of the present invention. As shown in FIG. 16, a source driver circuit 320B and the liquid crystal area 22B where the pixel circuit 310B is arranged are adjacent in the direction D1 (column direction), and the gate driver circuit 330B and the liquid crystal area 22B are adjacent in the direction D2 (row direction). The source driver circuit 320B and the gate driver circuit 330B are provided in the seal area 24B described above. However, the area where the source driver circuit 320B and the gate driver circuit 330B are provided is not limited to the seal area 24B, and it may be any area as long as it is outside the area provided with the pixel circuit 310B.

A source wiring 321B extends in the direction D1 from the source driver circuit 320B and is connected to the multiple pixel circuits 310B arranged in the direction D1. A gate wiring 331B extends in the direction D2 from the gate driver circuit 330B and is connected to the multiple pixel circuits 310B arranged in the direction D2.

The terminal area 26B is provided with a terminal part 333B. The terminal part 333B and the source driver circuit 320B are connected by a connecting wiring 341B. Similarly, the terminal part 333B and the gate driver circuit 330B are connected by the connecting wiring 341B. When the FPC 600B is connected to the terminal part 333B, an external device to which the FPC 600B is connected and the display device 20B are connected, and each pixel circuit 310B provided in the display device 20B is driven by a signal from the external device.

The transistor Tr1 shown in the first embodiment and the second embodiment is used for the pixel circuit 310B. The transistor Tr2 shown in the first embodiment and the second embodiment is applied to the transistor included in the source driver circuit 320B and the gate driver circuit 330B.

3-3. Pixel Circuit 310B of Display Device 20B

Figure 17:
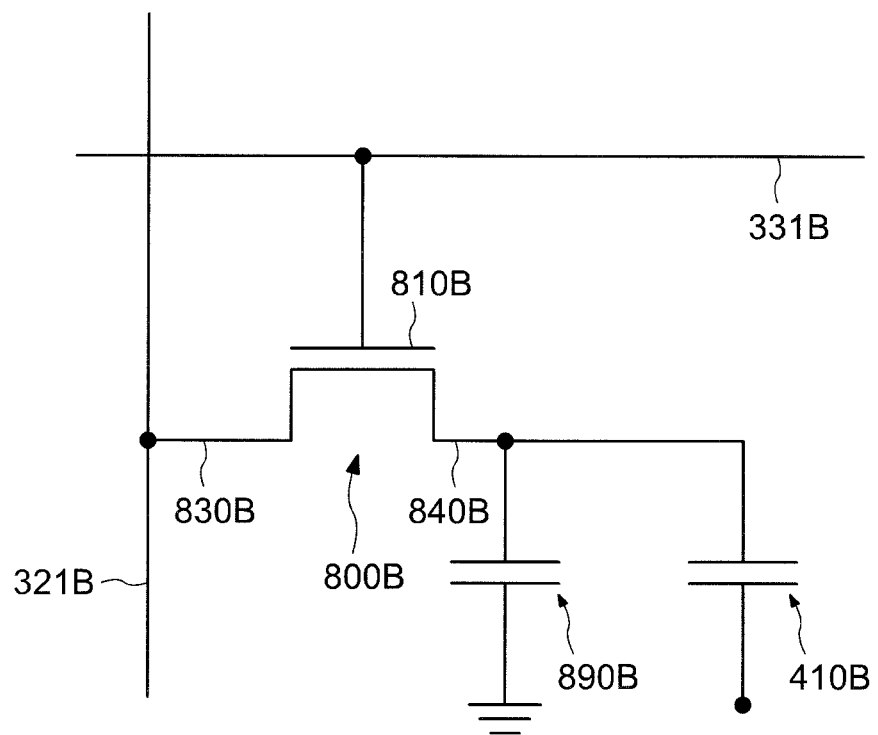
FIG. 17 is a circuit diagram showing a pixel circuit of a display device according to an embodiment of the present invention.

FIG. 17 is a circuit diagram showing a pixel circuit of a display device according to an embodiment of the present invention. As shown in FIG. 17, the pixel circuit 310B includes elements such as a transistor 800B, a storage capacitor 890B, and the liquid crystal element 410B. One electrode of the storage capacitor 890B is the pixel electrode PTCO and the other electrode is the common electrode CTCO. Similarly, one electrode of the liquid crystal element 410B is the pixel electrode PTCO and the other electrode is the common electrode CTCO. The transistor 800B includes a first gate electrode 810B, a first source electrode 830B, and a first drain electrode 840B. The first gate electrode 810B is connected to the gate wiring 331B. The first source electrode 830B is connected to the source wiring 321B. The first drain electrode 840B is connected to the storage capacitor 890B and the liquid crystal element 410B. The transistor Tr1 shown in the first embodiment and the second embodiment is applied to the transistor 800B shown in FIG. 17. In the present embodiment, for convenience of explanation, although 830B is referred to as a source electrode and 840B is referred to as a drain electrode, the function of each electrode as a source and a drain may be replaced.

Each of the embodiments described above as an embodiment of the present invention can be appropriately combined and implemented as long as they do not contradict each other. Further, the addition, deletion, or design change of components as appropriate by those skilled in the art based on each embodiment are also included in the scope of the present invention as long as they are provided with the gist of the present invention.

It is understood that, even if the effect is different from those provided by each of the above-described embodiments, the effect obvious from the description in the specification or easily predicted by persons ordinarily skilled in the art is apparently derived from the present invention.

What is claimed is:

1. A display device comprising: a first transistor, the first transistor including: an oxide semiconductor layer; a first gate electrode facing the oxide semiconductor layer; and a gate insulating layer between the oxide semiconductor layer and the first gate electrode, wherein the first gate electrode has hydrogen storage properties, the first gate electrode includes a first conductive layer, a second conductive layer having a lower resistance than the first conductive layer, and a third conductive layer having hydrogen storage properties, the second conductive layer is arranged between the first conductive layer and the third conductive layer, and the first conductive layer, the second conductive layer and the third conductive layer respectively have a tapered shape having an inclined plane facing upward.

2. The display device according to claim 1, wherein the third conductive layer is further from the oxide semiconductor layer than the first conductive layer, and a thickness of the third conductive layer is less than a thickness of the first conductive layer.

3. A display device comprising: a first transistor, the first transistor including: an oxide semiconductor layer; a first gate electrode facing the oxide semiconductor layer; and a gate insulating layer between the oxide semiconductor layer and the first gate electrode, wherein the first gate electrode has hydrogen storage properties, the first gate electrode includes a first conductive layer and a second conductive layer having a lower resistance than the first conductive layer, the first conductive layer and the second conductive layer respectively have a tapered shape having an inclined plane facing upward, the first gate electrode includes a fourth conductive layer having hydrogen storage properties, and the fourth conductive layer covers an upper surface and a side surface of the second conductive layer.

4. The display device according to claim 1, wherein the fourth conductive layer covers an upper surface and a side surface of the first conductive layer, and is in contact with the first gate insulating layer.

5. The display device according to claim 2, wherein the first gate electrode includes a fourth conductive layer having hydrogen storage properties, and the fourth conductive layer covers an upper surface of the third conductive layer and a side surface of the second conductive layer.

6. The display device according to claim 5, wherein the fourth conductive layer covers an upper surface and a side surface of the first conductive layer, and is in contact with the first gate insulating layer.

7. A display device comprising: a first transistor, the first transistor including: an oxide semiconductor layer; a first gate electrode facing the oxide semiconductor layer; and a gate insulating layer between the oxide semiconductor layer and the first gate electrode, wherein the first gate electrode includes a first conductive layer capable of forming a metal hydride on a surface of the first conductive layer, a second conductive layer having a lower resistance than the first conductive layer, and a third conductive layer having hydrogen storage properties, the second conductive layer is arranged between the first conductive layer and the third conductive layer, and the first conductive layer, the second conductive layer and the third conductive layer respectively have a tapered shape having an inclined plane facing upward.

8. The display device according to claim 7, wherein the third conductive layer is further from the oxide semiconductor layer than the first conductive layer, and a thickness of the third conductive layer is less than a thickness of the first conductive layer.

9. A display device comprising: a first transistor, the first transistor including: an oxide semiconductor layer; a first gate electrode facing the oxide semiconductor layer; and a gate insulating layer between the oxide semiconductor layer and the first gate electrode, wherein the first gate electrode includes a first conductive layer capable of forming a metal hydride on a surface of the first conductive layer, the first gate electrode includes a second conductive layer having a lower resistance than the first conductive layer, the first conductive layer and the second conductive layer respectively have a tapered shape having an inclined plane facing upward, the first gate electrode includes a fourth conductive layer having hydrogen storage properties, and the fourth conductive layer covers an upper surface and a side surface of the second conductive layer.

10. The display device according to claim 9, wherein the fourth conductive layer covers an upper surface and a side surface of the first conductive layer, and is in contact with the first gate insulating layer.

11. The display device according to claim 7, wherein the first gate electrode includes a fourth conductive layer having hydrogen storage properties, and the fourth conductive layer covers an upper surface of the third conductive layer and a side surface of the second conductive layer.

12. The display device according to claim 11, wherein the fourth conductive layer covers an upper surface and a side surface of the first conductive layer, and is in contact with the first gate insulating layer.

13. The display device according to claim 8, further comprising: a display region displaying an image; and a peripheral region surrounding the display region, wherein a plurality of pixel circuits are provided in the display region, a driver circuit configured to drive the plurality of pixel circuits is provided in the peripheral region, the first transistor is included in a pixel circuit provided in a pixel, and a second transistor is included in the driver circuit.

* * * * *